United States Patent [19]
Matsushima et al.

[11] Patent Number: 5,395,678
[45] Date of Patent: Mar. 7, 1995

[54] THIN FILM COLOR FILTER FOR LIQUID CRYSTAL DISPLAY

[75] Inventors: Fumiaki Matsushima; Mitsuro Atobe; Yoshihiro Ono; Yasuto Nose, all of Nagano, Japan

[73] Assignee: Seiko Epson Corporation, Tokyo, Japan

[21] Appl. No.: 714,970

[22] Filed: Jun. 13, 1991

Related U.S. Application Data

[62] Division of Ser. No. 344,636, Apr. 28, 1989, abandoned.

[30] Foreign Application Priority Data

| Apr. 30, 1988 | [JP] | Japan | 53-108726 |
| Jul. 12, 1988 | [JP] | Japan | 53-174102 |
| Jul. 13, 1988 | [JP] | Japan | 53-175610 |
| Jul. 28, 1988 | [JP] | Japan | 53-189201 |
| Jul. 28, 1988 | [JP] | Japan | 53-189202 |
| Oct. 6, 1988 | [JP] | Japan | 53-252524 |
| Oct. 7, 1988 | [JP] | Japan | 253043 |
| Oct. 13, 1988 | [JP] | Japan | 53-257819 |
| Oct. 25, 1988 | [JP] | Japan | 53-268507 |
| Nov. 9, 1988 | [JP] | Japan | 53-283418 |
| Nov. 18, 1988 | [JP] | Japan | 53-291497 |
| Nov. 26, 1988 | [JP] | Japan | 53-299039 |
| Jan. 11, 1989 | [JP] | Japan | 53-004038 |
| Jan. 31, 1989 | [JP] | Japan | 54-021505 |
| Jan. 31, 1989 | [JP] | Japan | 54-021509 |

[51] Int. Cl.⁶ ............................................. B32B 7/14
[52] U.S. Cl. ........................................ 428/201; 359/359; 359/360; 359/580; 359/581; 359/582; 359/585; 359/589; 359/885; 359/891; 428/1; 428/207; 428/209; 428/210; 428/323; 428/336; 428/432; 428/433; 428/434; 428/469; 428/470; 428/697; 428/699; 428/701; 428/702; 428/913; 430/7

[58] Field of Search .................. 428/1, 201, 207, 210, 428/432, 323, 336, 434, 433, 209, 470, 469, 697, 699, 701, 702, 913; 359/885, 891, 359, 360, 580, 581, 582, 585, 589; 430/7

[56] References Cited

U.S. PATENT DOCUMENTS

| 3,474,020 | 10/1969 | Tulagin | 430/78 |
| 3,915,703 | 10/1975 | Mori et al. | 430/46 |
| 4,670,188 | 6/1987 | Iwasa | 252/513 |
| 4,714,636 | 12/1987 | Yokona et al. | 428/1 |
| 4,853,296 | 8/1989 | Fukuyashi | 428/623 |

FOREIGN PATENT DOCUMENTS

| 0246334 | 11/1987 | European Pat. Off. |
| 0340968 | 11/1989 | European Pat. Off. |
| 57-89499 | 6/1982 | Japan |
| 60-208280 | 10/1985 | Japan |
| 243298 | 10/1988 | Japan |

OTHER PUBLICATIONS

Saji, et al., "Electro. Form. of a Phthalocyanine Thin Film" Chem. Letters 1988.
Saji, et al., "Electro. Form of Organic Thin Film", J. Am. Chem. Soc. 1987 109:5881-83.
Saji, et al., "Reversible Form. and Disruption of Micelles", J. Chem. Soc., Chem. Comm. 1985, pp. 865-866.

Primary Examiner—D. S. Nakarani
Attorney, Agent, or Firm—Stroock & Stroock & Lavan

[57] ABSTRACT

Thin film devices including a film of a functional organic material, inorganic material or mixtures which are either insoluble or sparingly soluble in water, and deposited by electroplating. Particles of the functional material are dispersed in a micelle solution of a surfactant which is oxidizable and reducible by electrolysis in a colloidal state. Thin film devices prepared include color filters, optical recording media, electrochemical photoreceptors, nonlinear switching elements, and other devices requiring thin films of materials which are substantially insoluble in water.

24 Claims, 8 Drawing Sheets

THIN FILM COLOR FILTER FOR LIQUID CRYSTAL DISPLAY

This is a division of application Ser. No. 07/344,636, filed Apr. 28, 1989, now abandoned.

BACKGROUND OF THE INVENTION

The invention relates generally to a thin film device and more particularly, to a method of electrochemically depositing a thin film of material that is substantially insoluble in water. Electrochemical deposition is made possible by increasing the solubility of the substance which is either sparingly soluble or insoluble in water by providing a micelle solution of a surfactant and electrochemically depositing the substance on an electrode. Such thin films are advantageously included in color filters for display devices, optical disks, electrophotographic photoreceptors and nonlinear switching elements as well as a wide variety of other applications.

Organic pigments such as phthalocyanine have recently become of interest as functional materials. The characteristic structure of these organic pigments are useful for photoconductors or optical devices. Because these organic pigments are generally either only sparingly soluble or insoluble in water, liquid processes are rarely adopted for producing thin films. Attempts have been made at converting substantially insoluble organic pigments into solvent-soluble pigments and forming a thin film by emersion coating methods or the like. Unfortunately, this method only provides an extremely thin film which has seriously restricted application of this method.

Employing a Langmuir Blodgett technique has similar drawbacks. Fine particles of an organic pigment can be kneaded with an organic binder and thinly coated to form a functional film. However, this method is inadequate for fully utilizing the properties of the functional substance to be formed in the thin film due to the presence of the binder.

Thin films of these substantially insoluble substances are conventionally formed by deposition, sputtering or chemical vapor deposition (CVD), but these methods also have drawbacks. For example, when a thin film is formed by one of these methods, the chemical structure of the thin film produced differs from that of the raw material and reproduction of the initial crystalline structure is often impossible even if the same chemical structure is produced. Further, such vacuum processes are expensive and improperly suited to mass production.

Another technique for forming these films has been proposed by Saji and others (Chem. Lett., 1431, (1987), J. Am. Chem. Soc., 109, 5881 (1987), Chem. Lett., 893 (1988), Synopses of Lectures of 55th Meeting of the Electrochemical Society of Japan). This method forms a thin film by solubilizing a hydrophobic pigment or a polymer in an aqueous micelle of an oxidizable and reducible surfactant formed of a ferrocene derivative in an aqueous medium. The solubilized pigment or polymer is deposited on an electrode by electrolysis. However, surfactants and other substances heretofore reported as adaptable to this method are extremely limited.

Accordingly, it is desireable to provide an improved method for depositing thin films of substantially insoluble substances by electrolytic techniques.

SUMMARY OF THE INVENTION

Generally speaking, in accordance with the invention, a method of depositing a thin film of a substance which is substantially insoluble or sparingly soluble in water by electrolysis of a solution and thin film devices prepared by this method are provided. The substance to be deposited includes a functional organic material, inorganic material or a mixture thereof. A surfactant is present in the solution and solubilizes the material to make electroplating of the functional material possible. In one embodiment novel surfactants are provided for film formation such as surfactants that are effective for forming a film of an organic pigment, such as a metal phthalocyanine pigment.

Accordingly, it is an object of the invention to provide an improved method for electrochemically depositing a thin film of a functional material that is substantially insoluble in water.

Another object of the invention is to provide thin film devices including thin films of various functional substances.

A further object of the invention is to provide surfactants that are useful in solubilizing materials to enable the formation of thin films of substances by electrolysis.

Still another object of the invention is to provide a method of improving the characteristics of thin film devices by forming the thin films by electrochemical techniques.

Yet another object of the invention is to provide an improved method of manufacturing color filters for display devices, optical disks, electrophotographic photoreceptors and nonlinear switching elements.

Still other objects and advantages of the invention will in part be obvious and will in part be apparent from the specification and drawings.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, references is had to the following description taken in connection with the. accompanying drawings, in which.

DESCRIPTION OF THE PREFERRED EMBODIMENT

Figure 1:
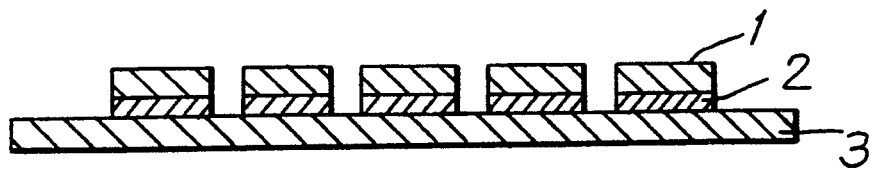
FIG. 1 is a cross-sectional view of a color filter prepared in accordance with the invention.

A thin film is prepared in accordance with the invention by preparing an electrolytic solution including a surfactant which is oxidizable, and preferably also reducible by electrolysis. The solution is an aqueous micellar solution of a surfactant which is at least positively charged by electrolytic oxidation and preferably also negatively charged by electrolytic reduction. A supporting electrolyte is dissolved in the aqueous solution. A quantity of fine particles of a material which is sparingly soluble or insoluble in water is dispersed in the aqueous solution in a colloidal state due to the action of the surfactant. This material will form the desired thin film of the device.

In general, not all of the particles of the material for the film, which are dispersed in aqueous micelle solution, assume a colloidal state. Typically, only the secondary particles assume a colloidal state. The secondary particles are an aggregate of the primary particles and have a particle size which allows them to be separated from the aggregate and to continue Brownian movement in the state of being surrounded by the micelle of the surfactant.

The particles dispersed in the aqueous micelle solution effectively assume a colloidal state when the solution is mechanically agitated vehemently by a propeller mixer or the like, or when the particles are ultrasonically dispersed by an ultrasonic homogenizer, or mechanically dispersed by a ball mill or the like. Immediately after dispersion, the particles which become colloidal particles and the particles which are too large to become colloidal particles and which will eventually precipitate out, are mixed with each other and should be separated. Thus, the dispersion is permitted to stand for several hours and then the supernatant is collected. Alternatively, the particles which are too large to become colloidal particles are separated by centrifugal separation or other suitable separation means.

Appropriate electrodes (an anode and a cathode) are next inserted in the colloidal electrolytic solution. Electrolysis is carried out at a constant voltage greater than or equal to the oxidation potential of the surfactant and electrolytic oxidation occurs on the surface of the anode. The surfactant which forms the micelle surrounding the particles of material for forming a thin film becomes positively charged all at once and the surfactant separates from the particles of the material for forming the thin film. As a result, the particles of the material for the film are released and deposit on the anode. After sufficient time, the anode becomes coated with a thin film of the desired material.

Appropriate surfactants which will at least become positively charged by oxidation from electrolysis, include those having a metallocene group having the following chemical composition at the hydrophobic end:

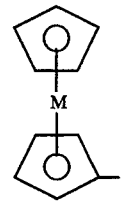

wherein M represents a metal such as Ti, Cu, V, Fe, Co, Ni, Ru and Os.

Metallocene groups, such as those including Fe are known. However, it has been determined that metallocene groups including mainly Cr and Ti also exhibit good film-forming properties. Because the oxidation potential of the compound varies with the metal, the metallocene group can be appropriately selected in accordance with the material of the anode.

It is preferred that the main chain of the surfactant have a hydrophilic portion and that the whole molecule is sufficiently hydrophilic to be soluble in water and that the surfactant forms a micelle. The absorptivity of surfactants which satisfy the above-described conditions can be enhanced by enlarging the hydrophobic group. The hydrophilic group can also be relatively enlarged to allow the material for the film to assume a stable micelle colloidal state in water.

It has also been found that surfactants having Cr or Ti in the metallocene group of the hydrophobic end group exhibit good properties in the formation of a metal phthalocyanine film. The chemical structure of such surfactants are as follows:

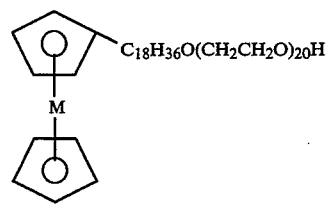

wherein M represents Cr or Ti.

The material for the thin film produced in accordance with the invention is not limited to those recited herein and may be either an organic material or an inorganic material as long as the surface of particles of the material can be surrounded by the micelle of the surfactant. Even if the surface of the particles is not hydrophobic, it can be used if the surface nature can be converted to a hydrophobic nature.

Almost all organic pigments are usable as materials for a film formed in accordance with the invention. Inorganic materials such as, oxides, nitrides, carbides and carbon can also be used. In particular, inorganic oxides are easily formed into a film by converting the surface into a hydrophobic nature. A mixture of organic material and inorganic material can also be used. Both organic materials and inorganic materials may be composites of two or more materials. For example, when forming a color filter for a display from an organic pigment, use of a composite of pigments can produce a pigment film having optimum spectral characteristics, as will be described later.

When manufacturing a thin film according to the invention, because the Brownian movement of the colloidal particles is the principal film-forming energy, the adhesion between the particles and the substrate (electrode) and the adhesion between the particles are weak. Accordingly, it is necessary to increase adhesion between the particles and the substrate and adhesion between the particles, especially during film formation by making the primary particles as small as possible. This enhances the surface energy and the cohesiveness of the primary particles. The diameter of the primary particles of the material for the film is preferably about 0.005 to 0.5 $\mu$m and more preferably about 0.005 to 0.05 $\mu$m.

A supporting electrolyte, such as an inorganic salt or an organic salt-is added to the electrolytic solution if necessary. Since the supporting electrolyte is added mainly to improve the electrical conductivity of the solution, it is not particularly restricted to any type of material as long as it does not obstruct formation of the micelle or formation of the film. The supporting electrolyte is preferably added before formation of the micelle. If it is added after the formation of a micelle, the micelle may be broken due to the influence of the added ions. This will cause recohesion of the material for film and interfere with desired film formation.

Electroplating techniques in accordance with the invention can be used to add dopant to a substrate. Doping has conventionally been tried with a phthalocyanine material in dry processes only. However, it is also possible to add dopant in a wet process in accordance with this embodiment of the invention to provide conductivity to a substrate. An organic material such as an organic pigment can be used as a material for the film. Phthalocyanine materials exhibit excellent conductivity properties and are preferable. A halogen, such as bromine and iodine is effective as a dopant.

Doping can be carried out by a wet process selected from the following two methods. One doping method uses a halogenated material as a supporting electrolyte in the electrolytic solution or adds a halogenated material such as LiBr, LiI, NaBr and NaI as a part of a supporting electrolyte to mix a halogen component with the film material during electrolysis. In another method, a thin film device is immersed in a solution containing a halogenated material. The halogen is introduced into the thin film by further electrolysis.

Examples of applications of the invention include, but are not limited to forming a thin film for: a color filter for a display device; a layer for an optical recording medium; an electrophotographic photoreceptor for a recording device; and a nonlinearly conductive layer for an active element. These will be described as follows.

It is also known to dispose a color filter at the inside of a display panel to add color to a liquid crystal display or a plasmatic display. Color filters are conventionally manufactured by relief dying, printing, pigment dispersion, deposition, electrode position or the like. A color filter is formed differently in accordance with the invention than conventional processes. A colored layer of the color filter is formed solely of an organic pigment by a liquid process at a low cost. Since the colored layer is formed solely of pigment, the spectral characteristics have good color purity even if the film thickness is about 1 $\mu$m or less.

A color filter prepared in accordance with the invention includes a transparent indium tin oxide (hereinafter referred to as "ITO") electrode, tin oxide electrode or the like, formed on a transparent substrate in a predetermined pattern and an organic pigment layer selectively formed on the transparent electrode. The electrodes on the transparent substrate (used as an anode) and an energizing electrode (used as a cathode) are immersed in a solution of a solubilized water-insoluble organic pigment in an aqueous micelle solution of a surfactant. Electrical conduction is established between a selected pattern of the transparent electrode and the cathode to deposit particles of the organic pigment on the selected portion of the transparent electrode. This process is repeated in an electrolytic solution containing different organic pigments and on other selected portions of the transparent electrode to form a multi-color filter for a liquid crystal display or the like. Using a thin film formed in accordance with the invention as a color filter for a liquid crystal display is advantageous because the transparent electrode used during electrolysis can be used for driving the liquid crystal without further processing.

The desired spectral characteristics are the most important characteristics of a color filter. It is sometimes difficult to obtain a particular wavelength absorbance using only one kind of pigment for one colored layer. The invention solves this problem by dispersing at least two kinds of pigments in an electrolytic solution, so that the deposited film contains both pigments. A colored layer is thereby formed with the desired spectral characteristic.

When forming a colored pattern of two or more colors on an electrode portion on which a pigment film has already been formed, energizing during another film forming step can result in another pigment film being unintentionally formed on the existing pigment film. To solve this problem, an insulating film or a highly resistive film is disposed on the unselected portion of the electrode pattern. This will prevent pigment from being deposited at non-desired locations. Afterwards, the resistive film can removed.

The insulating film or the highly-resistive film can be formed by various printing methods and photolithography methods. However, electrochemical polymerization is preferable in light of the costs involved. The material for the insulating film or high-resistance film is not specified herein, and a wide variety of materials are acceptable.

In a liquid crystal display device, a light-shielding film is provided to prevent transmitted backlight from leaking through gaps between the electrode patterns. Leaking diminishes contrast between ON and OFF portions. A light-shielding film can be formed between the transparent electrodes supporting pigment films to yield a black matrix color filter, for example, as follows:

A first method for providing a light-shielding film employs photolithography in accordance with the following process.

1. A transparent electrode is formed on a transparent substrate in a predetermined pattern.

2. A metal film is formed on the transparent electrode by electroplating or electroless plating. Electroplating makes it possible to form the metal film solely on the transparent electrode. When employing electroless plating, the metal film is formed on the entire surface of the substrate. The unnecessary portion of the metal film is then removed by photolithography, using a photosensitive resist or etching to leave the metal film only on the transparent electrode. Alternatively, it is possible to form a metal film only on the transparent electrode by using a mixed catalyst of Sn and Pd, which is unlikely to be adsorbed by a transparent substrate formed of an inorganic material such as glass, quartz and rock crystal.

3. The surface of the substrate on which the transparent electrode covered with the metal film is coated with a photosetting type photosensitive resin. The photosensitive resin can contain a light-shielding dye dissolved therein or a light-shielding pigment dispersed therein. The photosensitive resin can also lack dye or pigment.

4. The side of the substrate not coated with the light-shielding film is exposed with UV light. The metal film on the transparent electrode functions as an exposure mask and only the resin between the transparent electrode patterns is set by the UV exposure.

5. Subsequent developing and baking steps form a light-shielding film between the transparent electrode patterns. When using a photosensitive resin which does not contain dye or pigment at coating step 3, the resin is dyed in a subsequent dying step.

6. After etching the metal film on the transparent electrode, a pigment film is formed in accordance with the invention to yield a color filter provided with a light-shielding film (black matrix).

A second method for providing a light-shielding film employs a printing method. A liquid crystal panel including a light-shielding film is formed in accordance with the invention. A light-shielding film is formed with an ink containing a light-shielding material at the gaps between the transparent electrode patterns at which no pigment film for a color filter has been formed. Alternatively, a light-shielding film is formed on the substrate opposing the substrate having the transparent electrode thereon, at positions facing gaps between the transparent electrode patterns of the color filter. The light-shielding material contained in the link is not specified herein, but a non-conductive black pigment is preferable.

A thin film formed in accordance with the invention such as one that can be included in an optical recording medium is described as follows. It is known to include organic compounds such as pigments in an optical recording medium. However, when conventional vacuum deposition techniques are used to manufacture optical recording media, the characteristics of the thin film produced are unstable and vary with the positional relationship between the source of evaporation and the substrate in the chamber as well as heating conditions. Further, production yield is low and costs involved are high because vacuum processes are expensive.

Coating the substrate with an organic compound which is dissolved in an organic solvent has many advantages. However, many desirable compounds are only sparingly soluble in water. This severely limits the materials that can be coated in this manner.

To solve these shortcomings, the following method can be employed. Ultra-fine particles of an organic optical recording material, which is sparingly soluble or insoluble in water, are surrounded by a surfactant which is oxidizable and reducible by electrolysis and the particles assume a colloidal state. An electrically conductive optical disk substrate is immersed in the colloidal solution and a voltage is applied between the optical disk substrate and an energizing electrode. A plastic substrate such as a polycarbonate substrate is commonly used as an optical disk substrate and can be made conductive by coating the substrate with a conductive oxide material such as ITO or $SnO_2$ or a metal, by sputtering or vacuum deposition. The ultra-fine particles of the organic compound surrounded by the surfactant are then deposited on the substrate. A thin film of optical recording material is thereby formed.

An electrophotographic photoreceptor including a thin film may be formed in accordance with the invention as follows. An organic carrier generating layer ("CGL") of an electrophotographic photoreceptor is generally disposed on a drum by vacuum deposition; a coating method in which a carrier generating substance is dissolved in an appropriate solvent; an isochronous pulling method or the like; or a dispersion coating method in which a carrier generating substance is ground into fine particles in a dispersion medium by a ball mill or the like and the fine particles are dispersed with an adhesive, if necessary.

However, conventional vacuum deposition is not well suited to mass production techniques. Conventional coating methods are also disadvantageous because it is difficult to form a uniform film and because it lowers the density of the organic photosensitive material when a carrier generating substance is dispersed in a resin such as a binder. Low density film leads to deterioration of the desired characteristics.

To solve these problems, a high-efficiency carrier generating layer ("CGL") prepared in accordance with the invention from various organic photosensitive materials with high productivity by forming a high-density and high-purity film. First, an organic photosensitive material (organic pigment) having a low solubility is solubilized in a solution by the micelle formed by a surfactant containing a metallocene group to yield an electrolytic solution. Second, a support having electric conductivity such as a conductive drum and a counter electrode are immersed in the electrolytic solution. Third, voltage is applied between the support and the counter electrode. The organic photosensitive material in the micelle is thereby deposited on the support and forms a thin film CGL.

Figure 10:
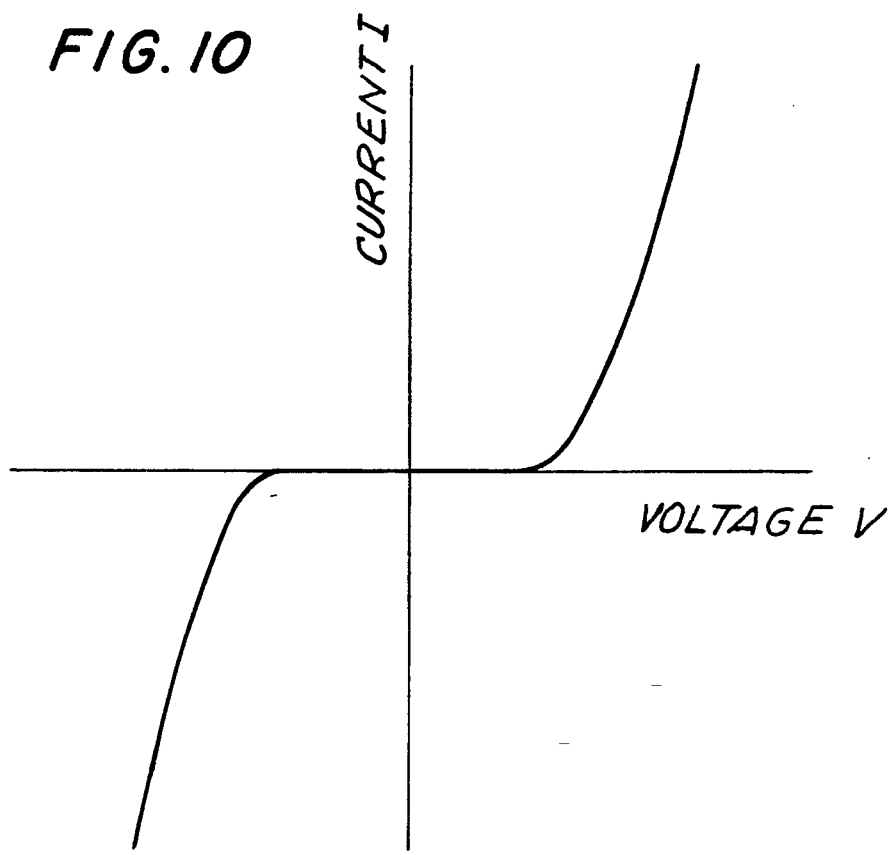
FIG. 10 is a graph illustrating an example of nonlinear current-voltage characteristics.

A nonlinear switching element (active element) including a thin film formed in accordance with the invention can be prepared as follows. It is known that a thin film-laminate structure including a first metal layer, an insulating film and a second metal layer (hereinafter referred to as a "MIM") exhibits a bi-lateral nonlinear voltage-current characteristic, as shown in FIG. 10. A MIM elements such as those formed of overlapping layers of Ta, $Ta_2O_5$ and Cr have been put to practical use as liquid crystal switching elements for liquid crystal devices, such as LCD televisions.

An important factor in the efficiency of a MIM element used as a liquid crystal driving switching element is a steep nonlinear drop of the resistance to current with increasing voltage. It is therefore necessary that a voltage applied to the switching element is sufficient for retaining the switching function. Specifically, if it is assumed that the MIM element and the liquid crystal device have a linear structure, the capacitance of the element, i.e. the capacitance of the insulating layer should be as small as is practical.

When including inorganic oxides as the insulating material the dielectric constant thereof is generally large. For example, it ranges from about 25 to 27 in the case of a Ta₂O₅ insulating layer. Therefore, in order to reduce the capacitance, the area of the element should be reduced or the thickness of the insulating material should be increased. This relationship is illustrated by the following equation:

$$C = \frac{\epsilon S}{9 \times 10^{11} \times 4\pi d}$$

wherein:
ε is the dielectric constant;
S is the effective area; and
d is thickness.

However, when the thickness is increased, the resistance also increases, often to unacceptable values. Accordingly, the capacitance is generally reduced by reducing the effective area of the element. The area of the switching element commonly included in a liquid crystal television is 5 μm square. This requires precise manufacturing techniques. Further, extensive use of vacuum film-forming apparatuses and dry etching devices reduces manufacturing throughput, and disadvantageously raises manufacturing costs.

As described above, it has not been possible to produce a bi-lateral nonlinear liquid crystal driving switching element conveniently at low cost. To solve the shortcomings of the prior art, an organic material having a small dielectric constant is used as an insulating material. This allows the switching element to be formed with a large area. For example, the insulating material can be formed from a phthalocyanine material, which is chemically stable, by an electrochemical process to reduce manufacturing costs.

It is known that phthalocyanine materials exhibit what is called diode characteristics. However, it has not been previously reported that phthalocyanine materials exhibit uniform bi-lateral nonlinear characteristics such as that shown in FIG. 10. A nonlinear switching element can be formed in accordance with the invention by forming an insulating film on a conductive material with a wet electrochemical process. A film of a conductive material is then formed on the insulating film to yield a MIM element.

The insulating film is formed by first dispersing the particles of a non-linearly conductive material in an aqueous micelle surfactant solution. The solution is then charged during electrolysis so that the particles are surrounded by the micelle of the surfactant in a colloidal state. A conductive material on the substrate of the thin film device is immersed in the solution as an electrode for effecting electrolysis. The current electrically destroys the micelle and the particles of the non-linearly conductive material surrounded by the micelle are deposited on the conductive material.

A metal or an oxide conductive material such as In₂O₃ and SnO₂ and the like are preferable as the conducive materials for the substrate. A phthalocyanine material is preferable as the insulating material of the primary particles. A metal or an oxide conductive material are preferable as the conductive material covering the insulating film.

The invention will now be explained in greater detail with reference to the following examples. These examples are presented for the purpose of illustration only, and are not intended to be construed in a limiting sense.

EXAMPLE 1

Several thin film devices were manufactured with various organic pigments as the thin film, including copper phthalocyanine, halogenated copper phthalocyanine, anthraquinone pigments, thioindigo pigments, monochlorocopper phthalocyanine, perylene pigments, quinacridone pigments, dioxazine pigments, nitro pigments, nitroso pigments, azo complex salt pigments, condensed azo pigments, metal complex pigments, benzoimidazolone pigments, aniline black, daylight fluorescent pigments, isoindolinone pigments, quinophthalone pigments, perinone pigments and diketopyrrolopyrrole pigments.

The following four surfactants were used to form the micelle.

Surfactant A:

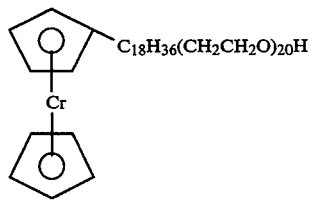

Surfactant B:

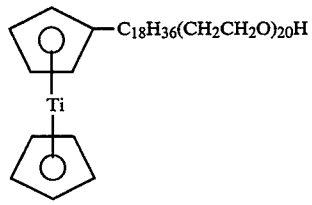

Surfactant C:

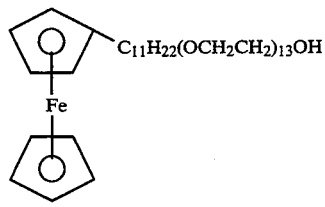

(Ferrocenyl-PEG, Produced by Dojin Kagaku)

Surfactant D:

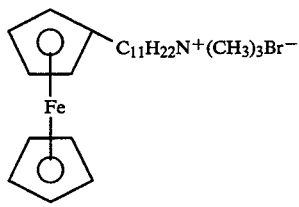

(Ferrocenyl-TMA, produced by Dojin Kagaku)

Surfactants A and B were developed by the inventors to obtain optimum film-forming properties of phthalocyanine materials. Surfactants C and D Ere commercially available. Experimental conditions and pigment films prepared are listed in Table 1.

To form thin films of pigment on a substrate, the surfactant, and the supporting electrolyte were dissolved in 600 ml of water and 2 to 10 g/l of an organic pigment was added. The organic pigment will form the film. The pigment was dispersed for 1 hour by an ultrasonic homogenizer (RUS-600, produced by Nihon Seiki) and after the dispersion was allowed to stand for 12 hours, 100 ml of the supernatant was collected.

The collected liquid was charged in an H-type cell and electrolysis was carried out for 30 minutes in a nitrogen atmosphere, using a glass substrate having an ITO film formed thereon as an anode; a platinum plate as a cathode; and a saturated calomel electrode (hereinafter referred to as "S.C.E.") as a reference electrode. After electrolysis was completed, the substrate on which the film was formed was washed with water and dried.

Electrolysis was carried out in an $N_2$ atmosphere to prevent oxidation of the surfactant. The pigment added to the liquid had been pulverized chemically or physically and had a particle diameter of not more than about 0.5 μm.

These experiments show that films of various pigments were acceptably produced by a wet electrochemical process. Typical films formed in accordance with the invention are shown in Table 1. However, the pigments, surfactants and supporting salts used accordance with the invention are not limited to those shown in Table 1. Both surfactant A and B exhibited good film-forming properties with respect to metal phthalocyanine pigments.

EXAMPLE 2

Ferrocenyl-PEG (produced by Dojin Kagaku) having a metallocene group containing Fe was included as a surfactant for an electrolyte solution for forming a thin film. 1 liter of an aqueous. micelle solution containing 4 mM of Ferrocenyl-PEG was prepared and 0.1M/l of LiBr was added as a supporting electrolyte. 15 g of a carbon powder having a particle diameter of 0.05 μm (the primary particles) was added to the solution as an inorganic material and dispersed by an ultrasonic homogenizer.

A platinum plate counter electrode, a saturated calomel reference electrode (S.C.E.) and a glass substrate provided with an ITO film sample electrode were immersed in the dispersion. Electrolysis was conducted for 1 hour at an electrolytic potential of +0.5 V (vs. S.C.E.) and an acceptable carbon film was formed on the ITO film by this wet process.

EXAMPLE 3

An aqueous micelle solution containing Ferrocenyl-PEG was prepared as in Example 2. 15 g of a silica powder which had been treated to be hydrophobic was added and dispersed by an ultrasonic homogenizer. To make the silica powder hydrophobic, epoxy silane (SH-6040, produced by TORAY) was dissolved in silica sol (produced by Shokubai Kasei, particle diameter: 0.02 μm) which had been dispersed in isopropyl alcohol and

| | Pigment | Surfactant Kind | Surfactant concn. | Supporting electrolyte Kind | Supporting electrolyte concn. | anode potential* | thickness of depo film | Remark |
|---|---|---|---|---|---|---|---|---|
| 1 | α type copper phthalocyanine | A | $3^{mM}$ | LiBr | $0.05^M$ | +1.0V | 0.9 μm | Dainichi Seika K.K. |
| 2 | Phthalocyanine Green | A | ↑ | ↑ | ↑ | ↑ | 1.1 | BASF |
| 3 | Dianthraquinonyl red | A | ↑ | ↑ | ↑ | ↑ | 1.0 | Pigment Red 177 |
| 4 | Thioindigo Magenda | A | ↑ | ↑ | ↑ | ↑ | 0.4 | Pigment Violet 177 |
| 5 | Monochlorocopper phthalocyanine | B | 2 | KCl | 0.1 | ↑ | 0.7 | Dainichi Seika K.K. |
| 6 | Perylene Red | B | ↑ | ↑ | ↑ | ↑ | 0.8 | Pigment Red 190 |
| 7 | Quinacridone Red | B | ↑ | ↑ | ↑ | ↑ | 0.6 | Pigment Violet 19 |
| 8 | Dioxazine Violet | C | 3 | $Li_2SO_4$ | 0.05 | +0.45 | 0.8 | Pigment Violet 23 |
| 9 | Naphthol Yellow-S | C | ↑ | ↑ | ↑ | ↑ | 0.4 | Acid Yellow 1 |
| 10 | Naphthol Green-B | C | ↑ | ↑ | ↑ | ↑ | 0.4 | Pigment Green 8 |
| 11 | Nickel Azoyellow | C | ↑ | ↑ | ↑ | ↑ | 0.5 | — |
| 12 | Chromophthal Yellow-GR | C | ↑ | ↑ | ↑ | ↑ | 0.5 | Pigment Yellow 95 |
| 13 | Irgazine Yellow-5GLT | C | ↑ | ↑ | ↑ | ↑ | 0.4 | Pigment Red 129 |
| 14 | Aniline Black | C | ↑ | ↑ | ↑ | ↑ | 0.4 | Pigment Red 176 |
| 15 | Lumogen Yellow | C | ↑ | ↑ | ↑ | ↑ | 0.4 | Pigment Black 1 |
| 16 | Benzoimidazolone HF3C | C | ↑ | ↑ | ↑ | ↑ | 0.4 | BASF |
| 17 | Isoendorinone Yellow Greenish | D | 2 | ↑ | ↑ | +0.6 | 0.4 | Pigment Yellow 109 |
| 18 | Quinophthalone Yellow | D | ↑ | ↑ | ↑ | ↑ | 0.4 | Pigment Yellow 138 |
| 19 | Perinone Orange | D | ↑ | ↑ | ↑ | ↑ | 0.5 | Pigment Orange 43 |
| 20 | Irgazine DPP Red BO | D | ↑ | ↑ | ↑ | ↑ | 0.4 | Pigment Red 254 | had a concentration of 5 wt %. After the solvent evaporated, the residue was baked at 120° C. for 1 hour to introduce the epoxy group into the surface of the silica particles. After the residue was baked, the silica particles were pulverized into particles having a diameter of not more than about 0.4 μm.

A platinum plate counter electrode, a saturated calomel electrode reference electrode (S.C.E.) and a glass substrate provided with an ITO film sample electrode were immersed in the dispersion. Electrolysis was conducted for 1 hour at an electrolytic potential of +0.5 V (vs. S.C.E). An acceptable $SiO_2$ film was formed on the ITO film.

EXAMPLE 4

The following substance having a metallocene group containing Cr was used as the surfactant:

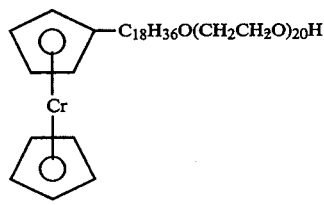

1 liter of an aqueous micelle solution containing 3 mM of the surfactant was prepared and 0.1M of LiBr was added thereto as a supporting electrolyte.

Monochlorocopper phthalocyanine and a phthalocyanine pigment were pulverized by a sand mill so that the maximum particle diameter of the primary particles were not more than about 0.4 μm. The average particle diameter was not more than about 0.05 μm. Particle diameter was measured by an SEM (S-900, produced by Hitachi, Ltd.). 5 g of the thus-prepared phthalocyanine was added to the micelle solution and dispersed by an ultrasonic homogenizer.

A platinum plate counter electrode, a saturated calomel electrode (S.C.E.) reference electrode and a glass substrate provided with an ITO film sample electrode were immersed in the dispersion. Electrolysis was conducted for 30 minutes at an electrolytic potential of +1.0 V (vs. S.C.E.). An acceptable 4,000 Å thick film of monochlorocopper phthalocyanine was formed on the ITO film. The substrate was washed with running water, dried by blowing air and then baked at 200° C. for 1 hour. When adhesive tape was pressed to the substrate and stripped off, as an adhesion test, the monochlorocopper phthalocyanine film was not stripped from the; ITO film at all.

For comparison, 5 g of monochlorocopper phthalocyanine was added to a micelle solution prepared as in the above experiment. This sample was not pulverized with a sand mill. The maximum diameter of the primary particles was 1 μm and more than 70% of the primary particles had a diameter larger than 0.5 μm. Particle diameter was similarly measured by the SEM.

These particles were dispersed in the micelle solution as above and film formation on a glass substrate having an ITO film was attempted. When the substrate was drawn out of the solution, almost half the area of the film was stripped off. Accordingly, it has been determined that particle diameter has significant influence on the adhesion and the particle diameter should be not more than 0.5 μm. Preferably it should not be more than 0.05 μm.

EXAMPLE 5

1 liter of an aqueous micelle solution containing 10 mMi of Ferrocenyl-PEG was prepared. 20 g of carbon powder having an average primary particle diameter of about 0.05 μm and 0.1M of LiBr were added as an inorganic material and a supporting electrolyte, respectively, and dispersed by an ultrasonic homogenizer. A carbon film was formed from the dispersion on a glass substrate provided with an ITO film as in Example 1. The substrate was immersed in still water, washed then dried with hot air. The carbon film was formed with good adhesion and without being stripped off.

In the same manner, a carbon powder having an average primary particle diameter of 3 μm was dispersed in the micelle solution. Although a carbon film was formed on a glass substrate provided with an ITO film in the same way, the adhesiveness of the. carbon film was poor because of the large particle size and almost no film was formed. The particle diameter also has an influence on the adhesion in an inorganic material. The preferred particle diameter is not more than about 0.5 μm, more preferably not more than 0.05 μm.

EXAMPLE 6

1 liter of an aqueous micelle solution containing 3 mM of the following surfactant was prepared:

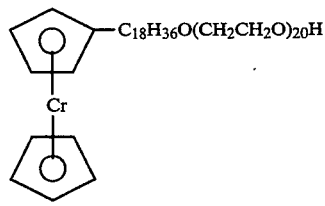

0.1M of LiBr was added and as a supporting electrolyte and potassium iodide was added as an iodine doping electrolyte. 14 g of Heliogen Green D914 produced by BASF was added to the solution and suspended in the solution by a 15-minute ultrasonic treatment The suspension was vehemently shaken for about 100 hours by a shaker and then allowed to stand. Thereafter the supernatant was collected and the particles which were not in a colloidal state were separated out.

The supernatant was charged into an H-type cell, and a glass substrate provided with an ITO film anode, a platinum plate cathode and a saturated calomel reference electrode (S.C.E.) were immersed. Electrolysis was performed for 30 minutes in an $N_2$ atmosphere at an electrolytic potential of +1.1 V (vs. S.C.E.). An iodine-doped phthalocyanine film was formed on the glass substrate provided with the ITO film. The film was about 5,000 Å thick and had an electric conductivity of about 1.0 S/cm. The film formed without iodine doping had an electric conductivity of only about $1 \times 10^{-10}$ S/cm.

EXAMPLE 7

Pulse electrolysis was carried out by using a solution and a cell similar to those used in Example 6. Repetitive pulses of 9 seconds at an electrolytic potential of +0.9 V (vs. S.C.E.) were applied for 30 minutes to obtain a phthalocyanine-iodine film on the ITO film on the glass substrate. The film was about 4,500 Å thick and had an electric conductivity of about $1\times10^{-1}$ S/cm.

EXAMPLE 8

1 liter of an aqueous micelle solution containing 4 mM of a surfactant similar to that of Example 6 was prepared. 0.2M of LiI was added as both a supporting electrolyte and an iodine doping electrolyte. 10 g of α type copper phthalocyanine was added to the solution as a phthalocyanine pigment and treated for 1 hour by an ultrasonic homogenizer. After the suspension was allowed to stand, the supernatant was collected.

The supernatant was charged into an H-type cell, and a glass substrate provided with an ITO film, a platinum plate and a saturated calomel electrode (S.C.E.) were immersed as an anode, a cathode and a reference electrode, respectively. Electrolysis was performed for 40 minutes at an electrolytic potential of +0.7 V (vs. S.C.E.). An iodine-doped phthalocyanine film was formed on the glass substrate provided with the ITO film. The film was about 6,000 Å thick and had an electric conductivity of about 2.0 S/cm. The film formed without iodine doping had an electric conductivity of about $1\times10^{-11}$ S/cm.

EXAMPLE 9

1 liter of an aqueous micelle solution containing 4 mM of a surfactant similar to that of Example 6 was prepared. 0.2M of LiBr was added thereto as a combined supporting electrolyte and a bromine doping electrolyte. 10 g of α type copper phthalocyanine was added to the solution as a phthalocyanine pigment and dispersed for 1 hour by an ultrasonic homogenizer. After the suspension was allowed to stand, the supernatant was collected.

The supernatant was charged into an H-type cell, and a glass substrate provided with an ITO film, a platinum plate and a saturated calomel electrode (S.C.E.) were immersed as an anode, a cathode and a reference electrode, respectively. Electrolysis was performed for 30 minutes in an $N_2$ atmosphere at an electrolytic potential of +1.0 V (vs. S.C.E.). A bromine-doped phthalocyanine film was formed on the glass substrate provided with the ITO film. The film was about 5,000 Å thick and had an electric conductivity of about $1\times10^{-2}$ S/cm. Thus, the doping effect of lowered resistivity was observed.

EXAMPLE 10

1 liter of an aqueous micelle solution of 3 mM of the following surfactant was prepared:

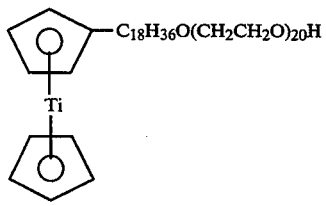

0.1M of $Li_2SO_4$ was added as a supporting electrolyte and 10 g of a β type copper phthalocyanine was added to the solution as a phthalocyanine pigment and dispersed in the solution for 90 minutes by an ultrasonic homogenizer. After the dispersion was allowed to stand, the supernatant was collected and the particles which were not in a colloidal state were separated out.

The supernatant was charged into an H-type cell, and a glass substrate provided with an ITO film, a platinum plate and a saturated calomel electrode (S.C.E.) were immersed as an anode, a cathode and a reference electrode, respectively, to effect electrolysis for 30 minutes in an $N_2$ atmosphere at an electrolytic potential of +0.8 V (vs. S.C.E.). A 5,000 Å thick phthalocyanine film was formed on the ITO film on the glass substrate.

The glass substrate provided with the ITO film and the phthalocyanine film formed thereon was immersed in a solution of 1.0M of potassium iodide. Electrolysis was carried out for 10 minutes at an electrolytic potential of +1.1 V (vs. S.C.E.) using the glass substrate with the ITO film and the phthalocyanine film formed thereon as an anode and a platinum plate as a cathode. After the iodine-doped phthalocyanine film was dried at 150° C., the electric conductivity was measured at 1.5 S/cm. The film formed without iodine doping had an electric conductivity of about $1\times10^{-10}$ S/cm.

EXAMPLE 11

A phthalocyanine film was formed on a glass substrate provided with an ITO film as in Example 10 and iodine was doped by using 1.0M of LiI solution as in Example 10. The electrolytic potential was +0.7 V (vs. S.C.E.) and the duration of electrolysis was 10 minutes. After the thus obtained iodine-doped phthalocyanine was heated and dried at 150° C., the electric conductivity was measured 1.4 as S/cm.

In Examples 6 to 11, it was possible to subject the phthalocyanine pigment to doping treatment to make it conductive by a wet process simultaneously or continuously with formation of the thin film.

Iodine and bromine were deposited only on the electrode and not on any other portions. Because doping is carried out in a solution, this method for making the pigment conductive dispenses with the need for countermeasures for the leakage of discharged gas or the like. Since it is possible to apply a uniform voltage to the electrode, the characteristic in plane is made uniform.

This doping method has advantages over conventional doping methods using vapor techniques in terms of both cost and characteristics of the resulting film. It is expected that these film forming techniques will greatly increase the applications of phthalocyanine pigments in electronic materials.

EXAMPLE 12

A thin film device formed in accordance with the invention has applications in providing color filters for liquid crystal display panels. A 1,000 Å thick ITO film was formed by sputtering on a soda glass substrate having a 6 inch diagonal, while heating the substrate to 300 ° C. The ITO film was patterned into a predetermined pattern by photolithography. A selected portion of the ITO film portion was connected to a power source and immersed together with a platinum plate as a counter electrode in an electrolytic solution with an organic pigment dispersed therein.

The electrolytic solution was prepared as follows. A Ferrocenyl-PEG (produced by Dojin Kagaku) surfactant having a metallocene group was included. 1 liter of an aqueous micelle solution containing 3 mM of Ferrocenyl-PEG was prepared. 0.2M of LiBr was added as a supporting electrolyte and 1.2 g of a red anthraquinone pigment, Chromophthal A3B (produced by Chiba Geigy) was added as an organic pigment. Those substances were suspended in the aqueous micelle solution of the surfactant by stirring. The suspension was ultrasonically treated for 1 hour by an ultrasonic homogenizer and after it was allowed to stand for 12 hours, 0.8 liter of the supernatant was collected as the electrolytic solution.

A voltage was applied to the predetermined pattern of the ITO film while using the selected portion of the ITO pattern on the glass substrate, a platinum plate, and a saturated calomel electrode (S.C.E.) as an anode, a cathode and a reference electrode, respectively, so as to effect electrolysis for 30 minutes at an electrolytic potential of +0.4 V (vs. S.C.E.). After electrolysis, the glass substrate provided with the ITO film was washed with water and dried. A 0.8 μm thick red pigment film of Chromophthal A3B was formed on the selected portion of the ITO pattern.

An electrolytic solution was prepared by mixing 1 liter of an aqueous micelle solution containing 3 mM of Ferrocenyl-PEG (produced by Dojin Kagaku) as a surfactant, 0.2M of LiBr as a supporting electrolyte and 1.2 g of a blue anthraquinone pigment, Indanthrene Blue (Pigment Blue 60, CI 69800) as an organic pigment. A voltage of +0.4 V (vs. S.C.E.) was applied to another selected portion of the ITO pattern using the glass substrate with the selected portion of the patterned ITO film and a platinum plate as an anode and a cathode, respectively, to effect electrolysis. A 0.7 μm thick blue pigment film was formed on the selected portion.

An electrolytic solution was prepared containing using a green organic metal phthalocyanine pigment, Heliogen Green D9140 (produced by BASF). The ITO substrate with the red and blue pigment films formed thereon was immersed together with a platinum plate in the electrolytic solution. A potential of +0.5 V (vs. S.C.E.) was applied to a selected portion of the ITO pattern with no pigment film formed thereon for 30 minutes to effect electrolysis. A green phthalocyanine film of 0.8 μm thick was formed on the selected portion.

In this manner, a three-color color filter having red, blue and green pigment film sections formed on predetermined portions of an ITO pattern was obtained, as shown in FIG. 1. Since the color filters included only pigment, it exhibited sufficient color densities in the respective film thicknesses. Using this color filter, a TN liquid crystal panel with a cell gap thickness of 10 μm was assembled.

By applying a voltage sine wave of 64 Hz to the red picture elements, the relationship between the practically applied voltage of the liquid crystal panel and the intensity of the light transmitted through the liquid crystal panel was examined. For comparison, a liquid crystal panel having a color filter produced by a relief dying method and a liquid crystal panel having no color filter were prepared and their properties were examined. The dyed color filter was obtained by spin coating a 1.5 μm thick photosensitive gelatin layer on a glass substrate provided with an ITO pattern and dying the photosensitive gelatin layer red with an acidic dye. The film thickness was 1.5 μm in order to obtain the color density of the same degree as that of the red pigment filter formed above in accordance with the invention.

Figure 2:
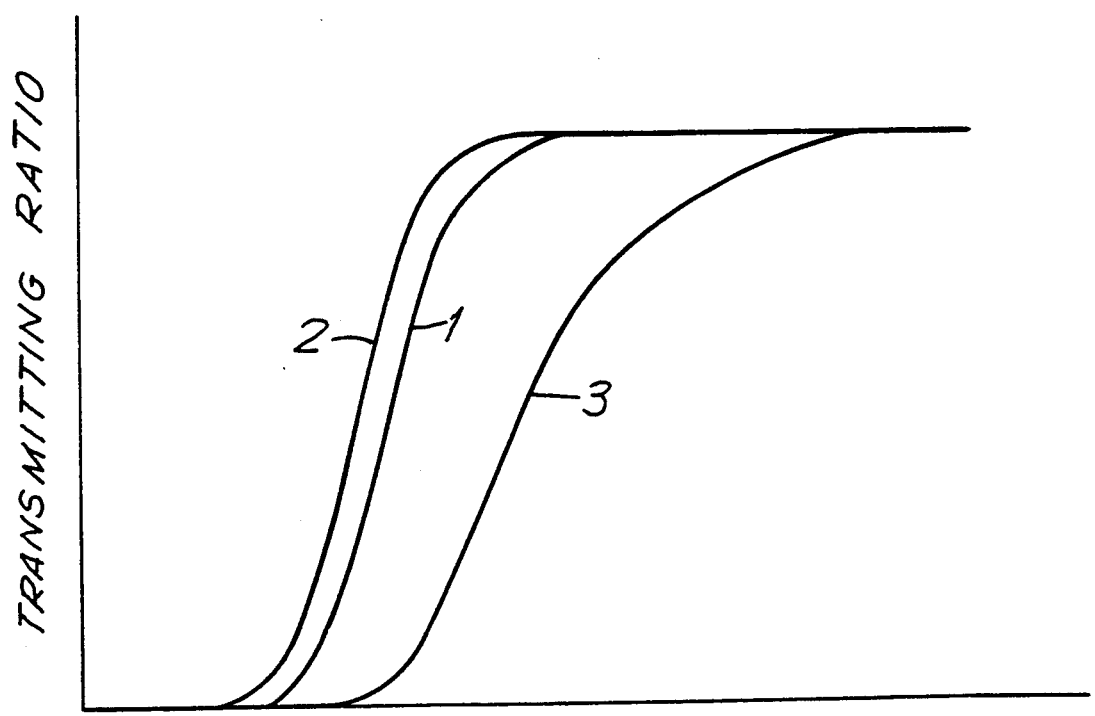
FIG. 2 is a graph comparing optical characteristics of a color filter prepared in accordance with the invention to those of conventional filters.

The results of these tests are shown in FIG. 2. The abscissa represents the effective applied voltage and the ordinate represents the transmittance ratio. The relationship between the voltage and transmittance is based on the assumption that the transmittance at an applied voltage of 0 is 0, and the maximum light transmittance of each panel is 100, to facilitate comparisons.

The threshold potential of the liquid crystal panel formed in accordance with the invention, represented by a curve 1, is about 5% higher than that of the liquid crystal panel without a color filter layer, represented by a curve 2. However, when compared with the liquid crystal panel having a color filter produced by a relief dying method, represented by a curve 3, the liquid crystal panel of the invention (curve 2) exhibits a large reduction in the threshold voltage and a steep change in transmittance. These are desirable characteristics for a color liquid crystal panel. These desirable characteristics are ascribed to the fact that the color filters prepared in accordance with the invention were formed only of pigment. In addition to having superior voltage-transmittance characteristics, by manufacturing a color filter in accordance with the invention which uses photolithography only in patterning the ITO layer and does not employ a vacuum apparatus, the mass production characteristics are also superior.

The electrode used for electrolysis in accordance with the invention is also the electrode for driving a liquid crystal display. However, the increase in driving voltage when a color filter layer is formed on the electrode is very small and the margin for the withstand voltage of a conventional integrated circuit ("IC") is increased. In addition, since it is possible to form an ITO film for driving a liquid crystal (the ITO film used for electrolysis) on a glass substrate the ITO film has high crystallinity, low resistivity and high durability, the color filter results in a liquid crystal panel having high reliability.

EXAMPLE 13

Figure 3:
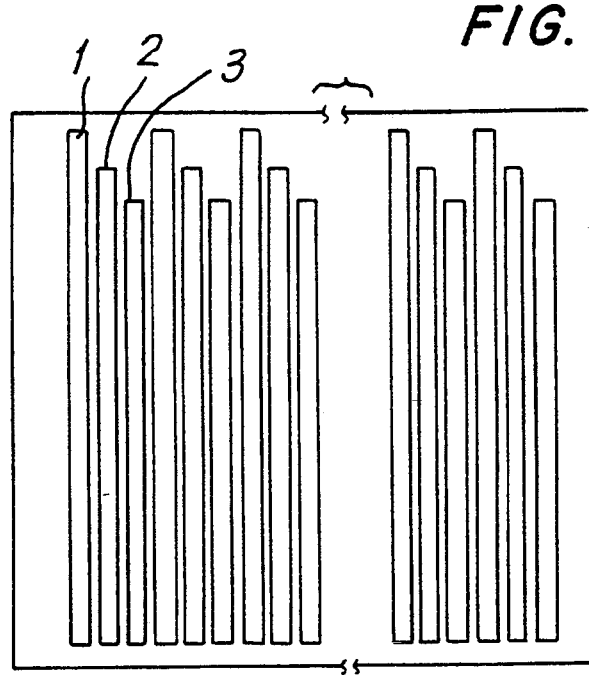
FIG. 3 is a top plan view of a substrate for a color filter formed in accordance with the invention.

To form a blue violet colored layer, 100 ml of a colloidal solution of two different pigments having the following composition was prepared.
1. Pigment:
   a. β type copper phthalocyanine (blue green pigment)—7 mM
   b. Dianthraquinonyl Red (red violet pigmentJ)—3 mM
2. Surfactant which is oxidizable and reducible by electrolysis:
   Ferrocenyl-PEG (produced by Dojin Kagaku)—2.5 mM
3. Supporting electrolyte:
   LiBr—0.05M A 1,500 Å thick transparent ITO film electrode was formed into a stripe pattern on a borosilicate glass substrate having a 5 inch long diagonal, as shown in FIG. 3. Electric conduction was selectively established on a pattern 1. The borosilicate glass substrate, a platinum electrode and a saturated calomel electrode (S.C.E.) were immersed in the above aqueous solution as an anode, a cathode and a reference electrode, respectively. Electrolysis was carried out in a nitrogen atmosphere at an electrolytic potential of +0.4 V (vs. S.C.E.) for 30 minutes. After electrolysis, the substrate was washed with water and baked at 180° C. so to enhance the adhesion of the deposited film. A 7,000 Å thick vivid blue violet pigment thin film was formed on ITO stripe pattern 1. The spectral characteristic of the pigment thin film was sufficient as a color filter, as indicated by a curve 1 in FIG. 4.

A green colored film was formed on the substrate provided with the blue violet film, electric conduction was selectively established on an ITO pattern 2. Electrolysis was carried out in a micelle colloidal solution containing two kinds of pigments having the following composition under the same conditions as in forming the blue violet film.

1. Pigment:
   a. β type phthalocyanine (blue green pigment)—6 mM
   b. Quinophthalone pigment (yellow pigment) Paliotol Yellow LO962HD, produced by BASF—4mM The remainder of the composition was the same as in forming the blue violet film.

An 8,500 Å thick vivid green pigment thin film was formed selectively on conductive ITO stripe pattern 2. The spectral characteristic of the pigment film was sufficient as a color filter, as indicated by a curve 2 in FIG. 4.

A red colored layer was formed on the substrate already provided with the blue violet thin film and the green thin film, electric conduction was selectively established on an ITO pattern 3 in FIG. 3. Electrolysis was carried out in a micelle colloidal solution containing three kinds of pigments having the following composition, under the same conditions as in forming the blue violet film.

1. Pigment:
   a. Dianthraquinonyl Red (red violet pigment)—7 mM
   b. Quinophthalone pigment (yellow pigment) Paliotol Yellow LO962HD, produced by BASF—2 mM
   c. Thioingido magenta (red violet pigment)—1 mM The remainder of the composition was the same as in forming the blue violet film. A 9,000 Å thick vivid red pigment thin film was formed on a selectively conductive ITO stripe pattern 3. The spectral characteristic of the pigment thin film was sufficient as a color filter, as indicated by a curve 3 in FIG. 4.

Figure 4:
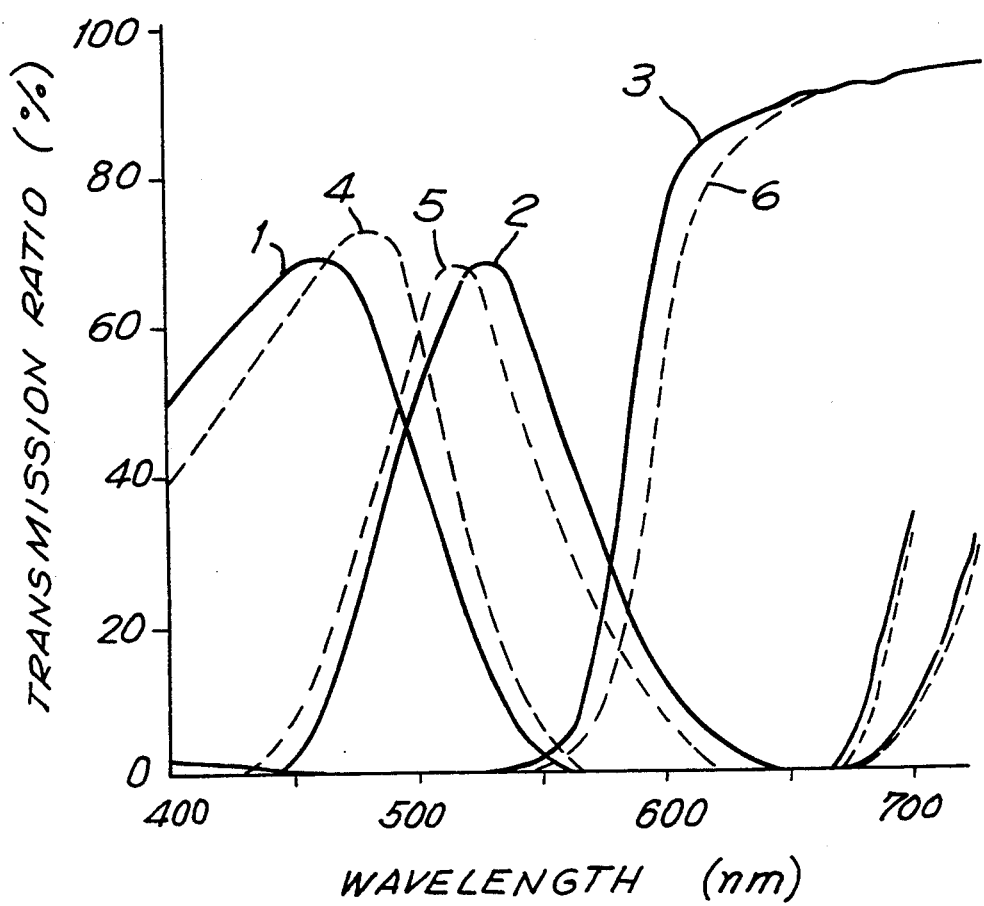
FIG. 4 is a graph comparing the spectral characteristics, of a color filter formed in accordance with the invention to those of conventional filters.

A set of curves 4, 5 and 6 in FIG. 4 show examples of the spectral characteristics of conventional color filters formed of only one kind of pigment, i.e., α type copper phthalocyanine, halogen-substituted copper phthalocyanine, and dianthraquinonly red, respectively. As shown, all of these conventional color filters have insufficient spectral characteristics. However, as described above, a color filter including three primary colors, red, green and blue violet having good spectral characteristics such as those represented by curves 1, 2 and 3 in FIG. 4 can be obtained when the films are prepared in accordance with the invention.

Color filters formed in accordance with the invention are not restricted to a three-color color filter and the order of layering the colored films is not restricted to that of Example 13. Accordingly, the manufacture of color filters having desired spectral characteristics is facilitated by using an electrolytic solution containing a mixture of a plurality of pigments. The electrochemical deposition in accordance with the invention facilitates the production of a rich variety of color tones and is therefore effective for the application of decoration or the like

EXAMPLE 14

Figure 5:
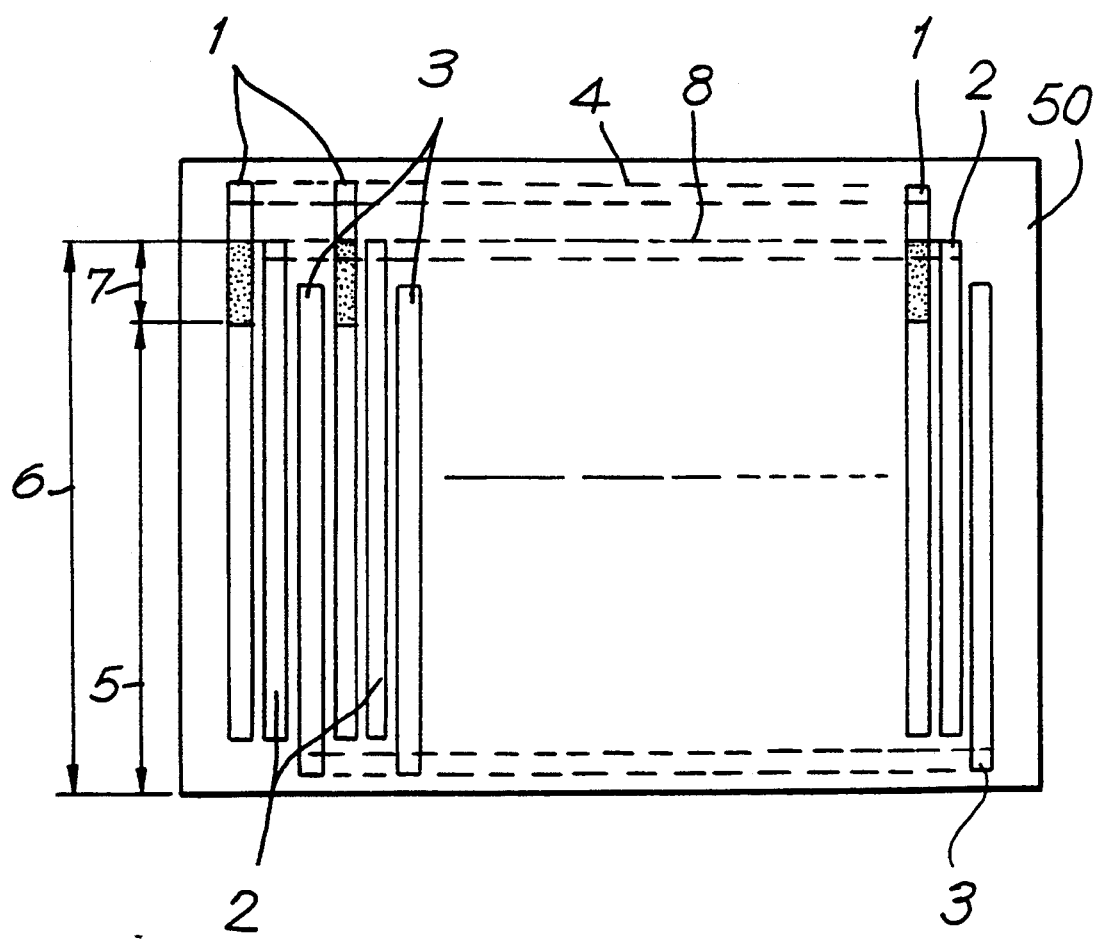
FIG. 5 is a top plan view of a color filter formed in accordance with the invention.

FIG. 5 shows a 5 inch diagonal transparent substrate 50 having a transparent ITO electrode formed thereon in a stripe pattern To form a blue violet colored layer, 1,000 ml of a colloidal solution containing a pigment and having the following composition was prepared.

1. Pigment:
   Monochlorocopper phthalocyanine 7 mM
2. Surfactant which is charged by electrolysis:
   Ferrocenyl-PEG (produced by Dojin Kagaku) 3 mM
3. Supporting electrolyte:
   LiBr 0.05M Electric conduction was established selectively by disposing a carbon paste on a selected electrode pattern 1 at the position represented by a broken line 4 in FIG. 5. Transparent substrate 50 was immersed in the colloidal solution. The region of the transparent substrate immersed in the colloidal solution is represented by a double arrow 5.

Electrolysis was carried out at a constant voltage of 0.9 V for 30 minutes, using transparent electrode 1 as an anode and a stainless plate as a cathode. In this manner, an 8,000 Å thick blue violet pigment film of monochlorocopper phthalocyanine was formed on stripe electrode pattern 1 in the region immersed in the solution. The substrate was washed with water and baked at 180° C. to improve adhesion of the pigment film to electrode 1.

An aqueous solution having the composition listed below was prepared. Electric conduction was selectively established at the position represented by a broken line 4 in FIG. 5 as described above. The substrate provided with the blue violet film was immersed in the solution in the region designated by a double arrow 6. Electrolysis was carried out at a constant potential of +0.7 V with respect to a saturated calomel electrode for 10 minutes.

Composition of electrolytic solution:

| Aniline | 0.1 M |
|---|---|
| $Mg(ClO_4)_2$ | 0.05 M |

As a result, a 7,000 Å thick electrochemically polymerized aniline film having a high electric resistance was formed only in a region represented by a double arrow 7 of electrode pattern 1. No aniline polymerized film was formed on the blue violet monochlorocopper phthalocyanine film, which was conductive, because the surface potential of the monochlorocopper phthalocyanine film does not reach the potential at which aniline is polymerized. This is due to the potential drop. The substrate was washed with water and dried at 120° C. for 15 minutes.

Electrical conduction was selectively established by disposing a carbon paste on the substrate at the position represented by a broken line 8 in FIG. 5, overlapping the aniline layer, so that conduction was not established with pattern electrode 1. Transparent substrate 50 was immersed in a colloidal solution containing a pigment, having the composition described below. Electrolysis was carried out under the same conditions in the above-described colloidal solution of the pigment.

1. Pigment:
   Dianthraquinonyl Red 8 mM
2. Surfactant which is charged by electrolysis:
   Ferrocenyl-PEG (produced by Dojin Kaguku) 3 mM
3. Supporting electrolyte:
   LiBr 0.05M A red film of dianthraquinonyl red was formed only on an electrode pattern 2 and was not formed on the blue violet pigment film formed on electrode pattern 1.

The red pigment film was selectively formed only on electrode pattern 2 because the aniline polymerized film present at the portion of electrode pattern 1 to which the carbon paste was applied insulated electrode pattern 1 so that electrical polymerization did not occur at pattern 1. The transparent substrate was heated and baked at 180° C. for 30 minutes to enhance the adhesion of the red pigment film.

Electric conduction was established selectively only on an electrode pattern 3 at the position represented by a broken line 9 in FIG. 5. Electrolysis was carried out in a colloidal solution containing a pigment and having the composition described below. The conditions for electrolysis were the same as during formation of the above-described color pigment films.

1. Pigment:
Copper phthalocyanine bromochloride 8 mM
2. Surfactant which is charged by electrolysis:
Ferrocenyl-PEG (produced by Dojin Kaguku) 3 mM
3. Supporting electrolyte:
LiBr 0.05M In this manner, an 8,500 Å thick green pigment film was formed electrode pattern 3.

In this fashion, a color filter formed with the three primary colors of blue, red and green was obtained. However, the pigments, surfactant, supporting electrolyte and film-forming conditions in accordance with the invention are not restricted to those in Example 14. Further, materials for the insulating film or high resistance film formed by electrochemical polymerization and the film forming conditions are not restricted to those described in Example 14. Dimethyl aniline, diethyl aniline, pyrrole, dimethyl phenol and diethyl phenol are also effective as primary materials.

As described above, it is easy to form a new color pigment film selectively on a substrate already supporting a conductive pigment film of another color on the desired electrode pattern without overlapping with the previously formed pigment film. The film forming method in accordance with invention is simple, low in cost and well suited for mass production.

EXAMPLE 15

Figure 6A:
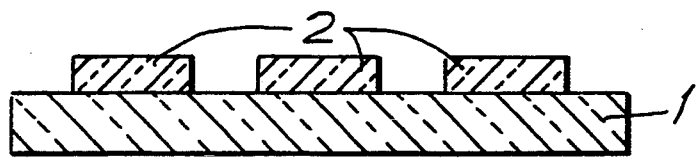
FIGS. 6A, 6B, 6C, 6D and 6E are cross-sectional views showing the steps for preparing a color filter including a light-shielding film in accordance with the invention.
Figure 6B:
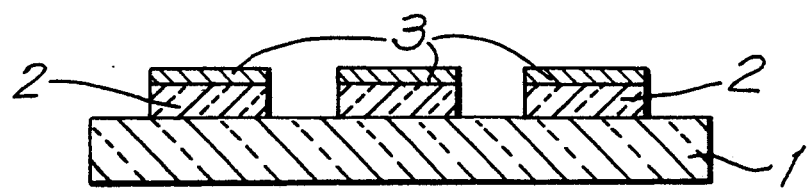
Figure 6C:
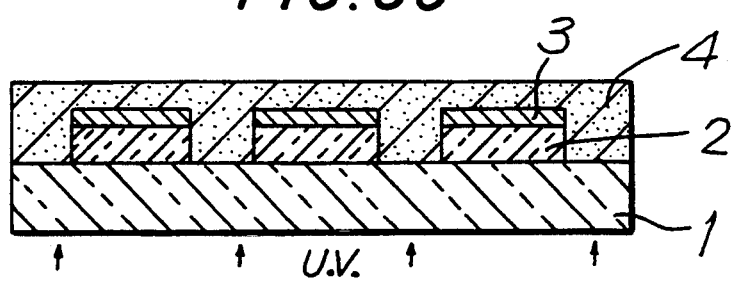
Figure 6D:
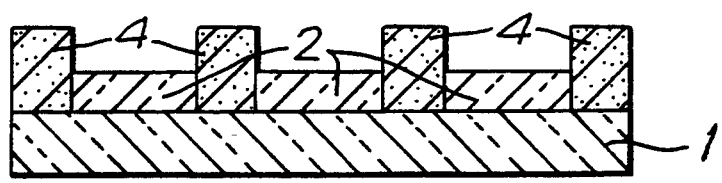

1. An ITO film having a predetermined pattern 2 was formed on a transparent glass substrate 1 as shown in FIG. 6A.
2. Substrate 1 was immersed in a mixed catalyst of Sn and Pd prepared in advance (HS-101B, produced by Hitachi Chemical Co., ltd.) for 1 minute then thoroughly washed with water. Thereafter, substrate 1 was immersed in inaqueous NaOH solution for 1 minute for acceleration then thoroughly washed with water. Substrate 1 was immersed in a nickel electroless plating solution (S680, produced by Nihon Kanizen) at 50° C. for 5 minutes. An electrolessly plated 4,000 Å thick nickel film 3 was formed only on ITO film 2 as shown in FIG. 6B.
3. Nickel-plated surface 3 of substrate 1 was coated with a 2 μm thick black overcoat layer 4 having oxygen barrier properties by spin coating a black overcoat of a color mosaic system produced by Fuji Hanto Electronics Technology K.K. as shown in FIG. 6C. The side of the substrate opposite black layer 4, exposed with UV light and the substrate was developed in a predetermined solution. The self alignment exposure allowed unexposed black layer 4 to be removed from electrolessly plated nickel film 3, and exposed black layer 4 remained between the nickel films. Thereafter substrate 1 was immersed in a concentrated nitric acid solution to dissolve and remove electrolessly plated nickel film 3 from ITO film 2 as shown in FIG. 6D.

Figure 6E:
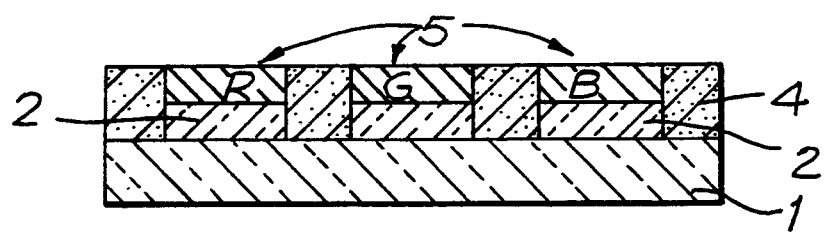

4. A set of red, green and blue pigment films 5 were formed on predetermined ITO electrode patterns 2 by an electrolytic method in accordance with the procedures of the invention, as shown in FIG. 6E. The electrolytic solutions for film formation of red, green and blue had the following compositions, respectively:

| Red: | Ferrocenyl-PEG (produced by Dojin Kagaku) | 2 mmol/l |
| | LiBr | 0.1 mol/l |
| Green: | Ferrocenyl-PEG | 2 mmol/l |
| | LiBr | 0.1 mol/l |
| | Phthalocyanine Green (produced by BASF) | 10 g/l |
| Blue: | Ferrocenyl-PEG | 2 mmol/l |
| | LiBr | 0.1 mol/l |
| | Monochlorocopper phthalocyanine (produced by Dainichi Seika) | 10 g/l |

These electrolytic solutions were thoroughly dispersed by an ultrasonic homogenizer. A platinum plate was used as a counter electrode and a saturated calomel electrode was used as a reference electrode. The films were formed in the order of green, blue and red, but this order is arbitrary. In this way, a pigment film color filter having a black matrix was obtained.

EXAMPLE 16

A 4,000 Å thick electrolessly plated nickel film was formed on an ITO electrode having a predetermined pattern as in Example 15. A 2 μm thick photosetting gelatin layer was formed on the nickel film side of the substrate by spin coating. The side of the substrate opposite the gelatin layer was exposed to UV light and the substrate was developed in a predetermined solution. The self-alignment exposure allowed removal of the gelatin layer from the electrolessly plated nickel film, leaving the exposed gelatin layer between the ITO film pattern. The substrate was then immersed in a concentrated nitric acid solution to dissolve and remove the electrolessly plated nickel film from the ITO film.

The gelatin layer remaining between the ITO electrode patterns was dyed with a black dye. Specifically, 10 g/liter of B181 produced by Nippon Kayaku Co., Ltd. was heated to 60° C. and the substrate was immersed therein. Red, green and blue pigment films were selectively formed on portions of the ITO film pattern by the same process as in Example 15 to yield a multicolor filter having a black matrix background.

EXAMPLE 17

A 4,000 Å thick electrolessly plated nickel film was formed on an ITO electrode having a predetermined pattern as in Example 15. A 2 μm thick layer of photosetting resin containing a light-shielding material kneaded by two rollers, was formed on the nickel film side of the substrate by spin coating. The photosetting resin had the following composition:

| Denacole | 100 g |
| Benzophenone | 2 g |
| Titanium Black (produced by Mitsubishi Metal Corp.) | 20 g |

After the side of the substrate opposite the photosetting resin layer was exposed with UV light, the substrate was developed in a predetermined solution. The self-alignment exposure allowed removal of the unexposed gelatin layer from the electrolessly plated nickel film, thereby leaving resin only between the ITO film pattern. The substrate was then immersed in a concentrated nitric acid solution to dissolve and remove the electrolessly plated nickel film from the ITO film.

Red, green and blue pigment films were formed on predetermined patterns of the ITO film as in Example 15 to yield a multi-color filter having a black matrix background.

EXAMPLE 18

A transparent ITO electrode having a predetermined pattern was formed on a transparent substrate. Red, green and blue pigment films were formed on predetermined ITO electrode patterns.

Electrolytic solutions for the film formation of the red, green and blue films had the following compositions and the following surfactant was used:

Surfactant:

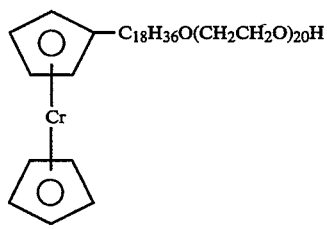

| Red: | Surfactant | 2 mM |
|---|---|---|
| | LiBr | 0.1 M |
| | Dianthraquinonyl Red (produced by Chiba Geigy) | 6 g/l |
| Green: | Surfactant | 2 mM |
| | LiBr | 0.1 M |
| | Phthalocyanine Green (produced by BASF) | 10 g/l |
| Blue: | Surfactant | 2 mM |
| | LiBr | 0.1 M |
| | Monochlorocopper phthalocyanine (produced by Dainichi Seika) | 10 g/l |

These electrolytic solutions were dispersed thoroughly for 1 hour by an ultrasonic homogenizer and the supernatant was collected after the dispersion stood for 10 hours.

Electrolysis was carried out at a potential of +1.0 V (vs. S.C.E.) for 30 minutes, using a platinum plate as a counter electrode and a S.C.E. as a reference electrode. Pigment films were obtained, each having a thickness of about 1 μm. The films were formed in the order of green, blue and red but this order is arbitrary.

A black ink layer was printed between the transparent electrode patterns on the substrate with the red, green and blue pigment films formed thereon by offset printing to form a light-shielding film. The black layer was printed with a TORAY waterless lithography plate (negative plate) and the ink layer was only formed between the transparent electrode patterns. The black ink contained a red pigment and a black pigment with a slight amount of carbon dispersed therein.

EXAMPLE 19

A black ink layer of the same pattern as in Example 18 was formed by offset printing on a counter electrode substrate formed to oppose a color filter used for a liquid crystal display panel. The counter electrode substrate was pasted to the color filter provided with red, green and blue pigment films to form a liquid crystal panel having a constant cell gap. The black ink layer on the opposing substrate served as a light-shielding film.

The substrates formed in Examples 15 to 19 were able to prevent lowering of contrast of the liquid crystal display due to light leaking from the gap between the red, green and blue pigment films. The resulting black-matrix color-filter liquid crystal panels exhibited superior qualities, compared to conventional panels.

EXAMPLE 20

FIGS. 7A, 7B, 7C and 7D are sectional views illustrating the steps for manufacturing an optical recording medium (ORM) in accordance with the invention. A 1.2 μm thick optical recording disk substrate 1 was formed of polycarbonate by injection molding. To provide conductivity to the substrate, a 600 Å thick ITO film 2 was formed on the surface of a plurality of disk substrate grooves by sputtering to form a conductive substrate 72. The inner and outer periphery of disk 1 was masked to prevent formation of ITO film 2 at those portions.

Figure 7A:
FIGS. 7A, 7B, 7C and 7D are cross-sectional views showing the steps for forming an optical recording medium in accordance with the invention.
Figure 7B:
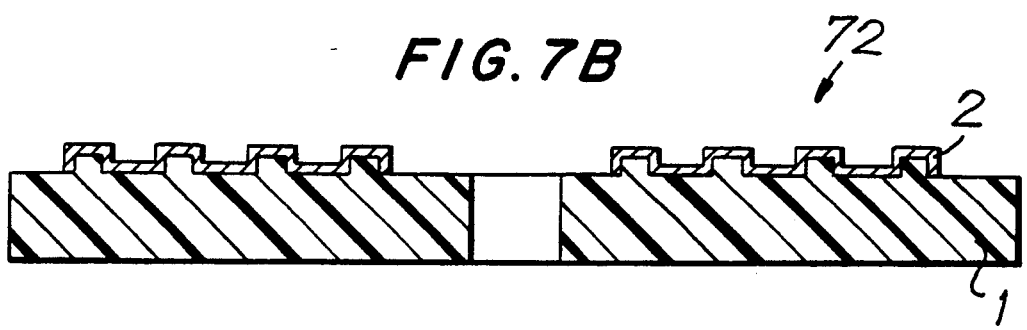
Figure 7C:
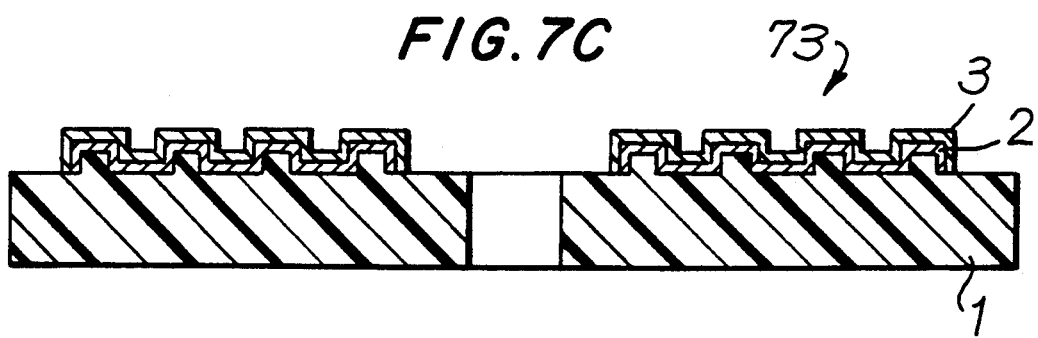
Figure 7D:
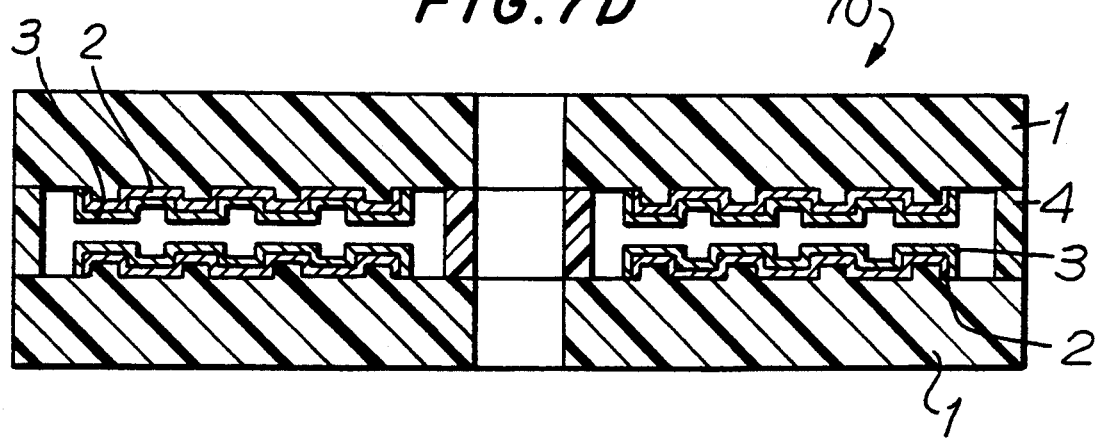
Figure 8A:
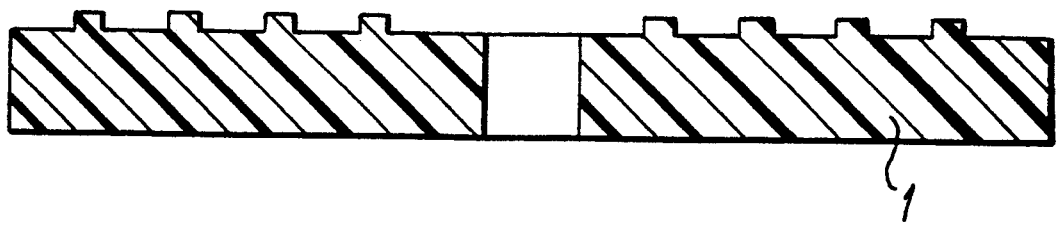
FIGS. 8A, 8B, 8C and 8D are cross-sectional views showing the steps of a process for forming an optical recording medium in accordance with the invention.
Figure 8B:
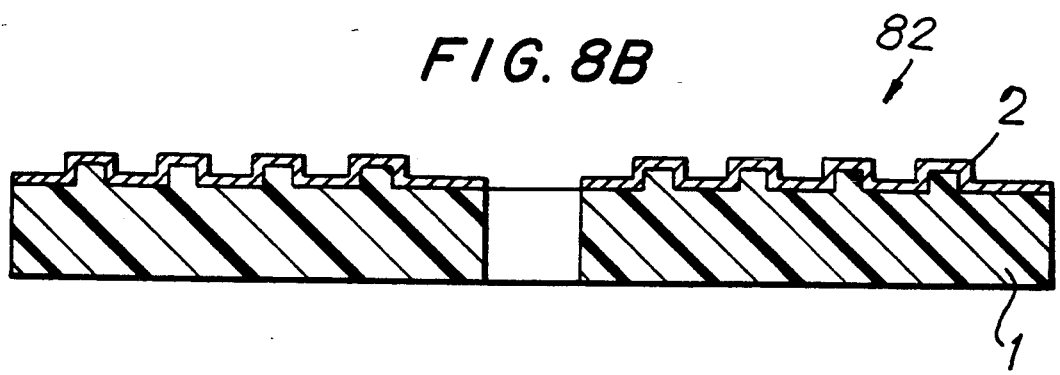
Figure 8C:
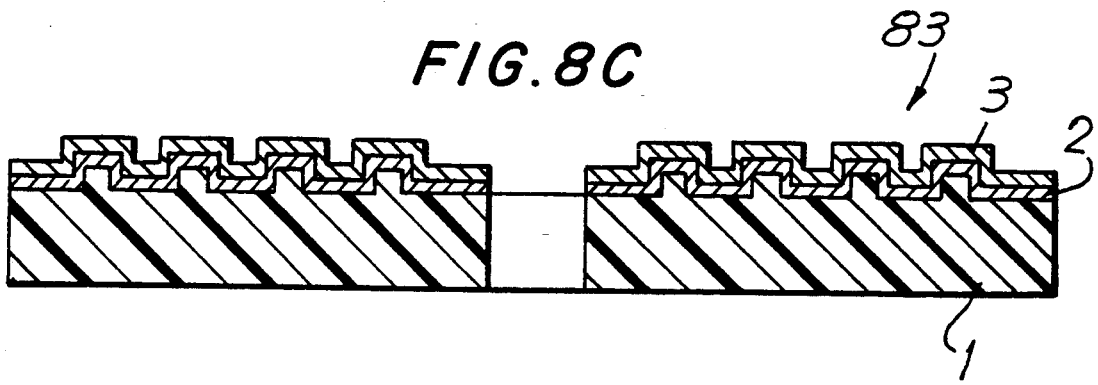
Figure 8D:
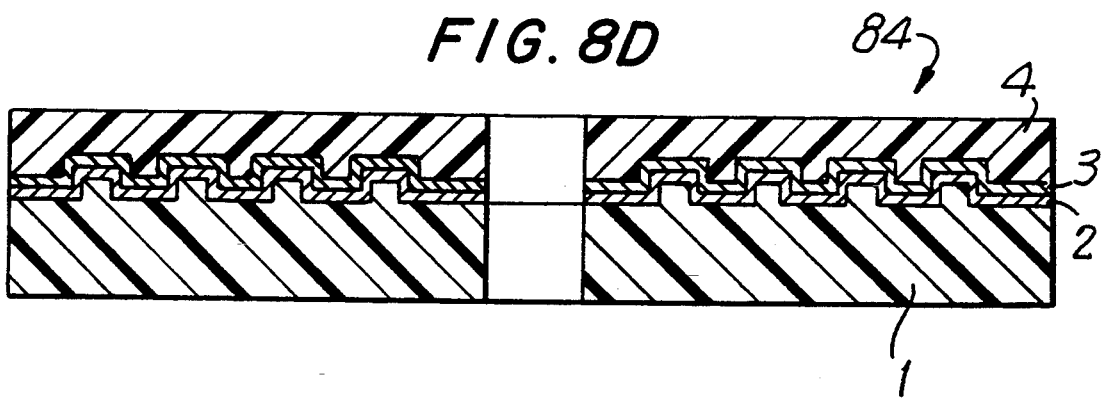

Coated substrate 72 was immersed in a micelle electrolytic solution containing fine particles of an indolenine cyanine pigment surrounded by a surfactant, in a colloidal state. Electrolysis was carried out by applying a voltage between conductive layer 2 of substrate 72 as an anode and a stainless steel plate as a cathode to form an 800 Å thick organic pigment film 3 on the surface of ITO layer 2 to form a coated substrate 73 as shown in FIG. 7C. A double-sided optical disk 70 was completed by pasting two similarly prepared coated substrates 73 together, separated by a spacer 4.

Pigment layer 3 was formed in accordance with the invention by using Ferrocenyl-PEG (produced by Dojin Kagaku) as the surfactant in the electrolytic solution. The composition of the electrolytic solution and the conditions for the electrolysis were as follows:

| Composition: | |
|---|---|
| Ferrocenyl-PEG | 2 mM |
| LiBr (supporting electrolyte) | 0.2 M |
| Indolenine cyanine pigment | 7 mM |
| Conditions for electrolysis: | |
| Potential | 0.9 V |
| Time | 5 min. |
| Temperature | 25° C. |
| Stirring | Gentle stirring |

EXAMPLE 21

A second optical recording medium 74 was formed in accordance with the invention. The preparation of second ORM 74 is also explained with reference to FIGS. 7A through 7D. A 1.2 mm thick polycarbonate optical disk substrate 1 was produced by injection molding. An 800 Å thick ITO (indium tin oxide) film 2 was formed on the surface of the grooves of substrates by sputtering to form a conductive substrate 72. The inner and outer periphery of substrate 1 was masked to prevent formation of ITO film 2 at those, positions.

Conductive substrate 72 was immersed in an electrolytic. solution containing fine particles of an indolinobenzopyran compound that were surrounded by a surfactant and were in a colloidal state. Electrolysis was carried out by applying a voltage between file 2 of substrate 72 as an anode and a stainless steel plate as a cathode to form a 1,000 Å thick organic photochromic film 3 on the surface of conductive substrate 72 to form a coated substrate 73.

A double-sided optical disk 74 was completed by pasting two coated optical disk substrates 73 together separated by a spacer 4.

Ferrocenyl-PEG (produced by Dojin Kagaku) was the surfactant in the electrolytic solution to form layer 3. The composition of the electrolytic solution and the conditions for electrolysis were as follows:

| Composition: | |
|---|---|
| Ferrocenyl-PEG | 3 mM |
| LiBr (supporting electrolyte) | 0.4 M |
| Indolinobenzopyran pigment Spiropyran | 9 mM |
| Conditions for electrolysis: | |
| Potential | 1.0 V |
| Time | 7 min. |
| Temperature | 30° C. |
| Stirring | Gentle stirring |

As shown in Examples 20 and 21, methods in accordance with the invention facilitate the formation of an organic pigment thin film on an optical disk substrate by a wet process which is accomplished with a simple apparatus and has high productivity. Thus, mass production of high-efficiency optical disks at a low cost is possible.

EXAMPLE 22

FIGS. 8A, 8B, 8C and 8D are sectional views illustrating the steps for manufacturing an optical recording medium (ORM) in accordance with another embodiment of the invention.

An optical disk substrate 1 is a 1.2 mm thick glass substrate having grooves that were formed on the surface by plasma etching. To provide conductivity, a 700 Å thick ITO (indium tin oxide) film 2 was formed on the surface of the grooves by sputtering to yield a conductive substrate 82.

Substrate 82 was immersed in an electrolytic solution containing fine particles of tetrasodium tetraporphyrin (hereinafter referred to as "TSTP") and polymethyl methacrylate (hereinafter referred to as "PMMA") that were surrounded by a surfactant, oxidizable and reducible by electrolysis to be in a micellar colloidal state. Electrolysis was carried out by applying a voltage between conductive substrate 82 as an anode and a stainless steel plate as a cathode to deposit both TSTP and PMMA on conductive surface 2 of conductive optical disk substrate 82. A 1,000 Å thin film 3 of a compound having a photochemical hole burning (hereinafter referred to as "PHB") effect was deposited to yield a coated substrate 83. An optical recording medium 84 was completed by providing a protective coat 4 on coated surface 3 of coated substrate 83.

Ferrocenyl-PEG (produced by Dojin Kagaku) was used as the surfactant in the electrolytic solution. The composition of the electrolytic solution and the conditions for electrolysis were as follows:

| Composition: | |
|---|---|
| Ferrocenyl-PEG | 3 mM |
| LiBr (supporting electrolyte) | 0.4 M |
| TSTP | 8 mM |
| PMMA | 10 mM |
| Conditions for electrolysis: | |
| Potential | 1.0 V |

-continued

| Time | 10 min. |
|---|---|
| Temperature | 28° C. |
| Stirring | Vehement stirring |

As described above, the invention facilitates the formation of a thin film of a compound having a PHB effect on an optical disk substrate by a wet process. A thin film of a compound having a PHB effect which is formed in accordance with the invention can be formed uniformly on a disk substrate. Since the dispersion of the material having a PHB effect as a guest into a host (transparent solid medium) is homogeneous, the characteristics can be very stable. Since this method can be performed with a simple apparatus and can lead to high productivity, mass production of high-efficiency optical disks at a low cost is possible.

EXAMPLE 23

Figure 9:
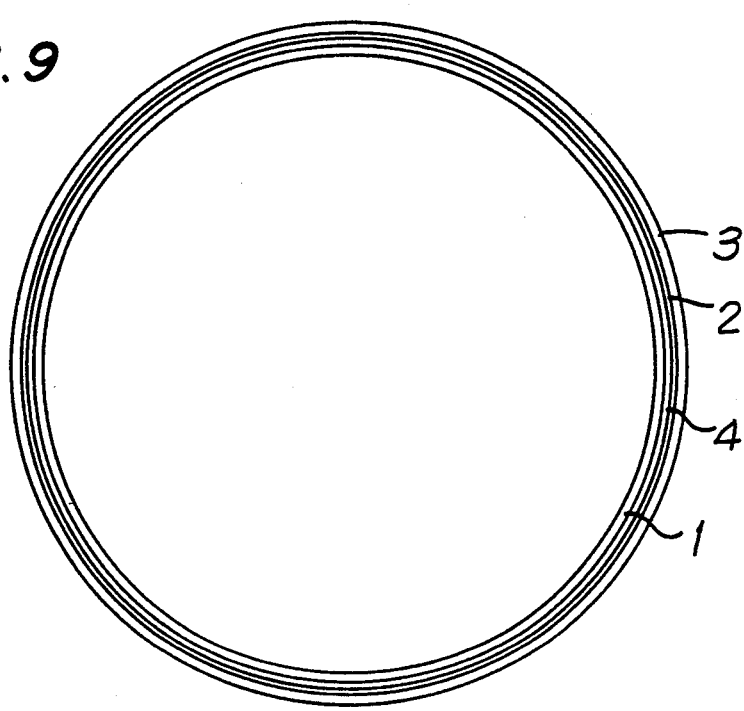
FIG. 9 is a partial cross-sectional view of an electrophotographic photosensitive drum formed in accordance with the invention.

FIG. 9 shows the structure of a multi-film electrophotographic photosensitive drum 90 formed in accordance with an embodiment of the invention. In this embodiment a 30 mm diameter, 1.5 mm thick and 20 cm long aluminum cylinder 1 was used as a conductive support. The surface of cylinder 1 was plated with a 2 μm thick layer of copper (Cu) 4. After copper layer 4 was mirror polished, an X-type phthalocyanine photosensitive layer 2 (carrier generating layer, hereinafter referred to as "CGL") was formed on copper layer 4 to a thickness of about 0.5 μm. A 20 μm thick carrier transporting layer 3 (hereinafter referred to as "CTL") of polyvinyl carbazole (hereinafter referred to as "PVK") was formed on CGL 2.

Photoconductive drum 90 was produced as follows. Aluminum drum 1 was finished with a diamond turning method to have a surface roughness of 0.002 μm. The polished surface of drum 1 was plated with a 2 μm thick layer of copper 4 and the surface was finished with a #6000 polishing tape. Polished copper plated drum 1 was immersed in an electrolytic solution in which X-type phthalocyanine was solubilized and electrolysis was carried out between plated drum 1 and a counter electrode to form X-type phthalocyanine CGL thin film 2 on the surface of copper layer 4 of drum 1. X-type phthalocyanine is difficult to dissolve in a solvent. This material was solubilized by including a surfactant containing a metallocene group in the electrolytic solution. The surface of CGL 2 was coated with PVK which had been dissolved in a solvent by an isochronous pulling method to yield a CTL coating 3 which had a thickness of 20 μm after drying.

The electrophotographic characteristics of the thus-produced electrophotographic photoreceptor were measured by a dynamic system using an electrostatic copying paper testing device SP-428 (produced by Kawaguchi Denki Seisakusho) and a 780 nm buffer filter. In the testing experiment, the surface potential $V_a$ of the photosensitive layer of the photoreceptor which had been charged for 5 seconds at a voltage of −6K was measured. Light from a tungsten lamp was projected on the photosensitive layer and the illumination on the surface was 35 lux. The exposure (erg/cm$^2$) necessary to attenuate the initial surface potential $V_a$ to one half its value was designated $E_{\frac{1}{2}}$. The voltage after an exposure of 15 erg/cm$^2$ was designated $V_b$.

The measurement was repeated 200 times, and the results of the first and 200th measurements are shown in the following table.

|            | First  | 200th  |
|------------|--------|--------|
| $V_a$ (v)  | −1250  | −1280  |
| $E_{\frac{1}{2}}$ erg/cm$^2$ | 3.5 | 3.6 |
| $V_b$ (v)  | 0      | 0      |

It is evident from the above table that an electrophotographic photoreceptor formed in accordance with this embodiment of the invention has sufficient charge retaining force, high sensitivity, and small residual potential. In addition, these desireable characteristics are maintained even after repeated use. Accordingly, the invention can provide an electrophotographic photoreceptor having excellent characteristics.

EXAMPLE 24

An aluminum drum formed as in Example 23 was immersed in an electrolytic solution in which a bisazo pigment was solubilized. A bisazo pigment thin film, about 0.3 μm thick, was formed on the surface of the aluminum drum as the photosensitive layer (CGL) as in Example 23. Triphenyl amine and polycarbonate were dissolved in 1,2-dichloroethane and the solution was applied to the CGL to form a CTL thereon, having a thickness of 20 μm after drying.

The photosensitive efficiency of the resulting photoreceptor was evaluated as in Example 23. The results are shown in the following table.

|            | First  | 200th  |
|------------|--------|--------|
| $V_a$ (v)  | −900   | −890   |
| $E_{\frac{1}{2}}$ erg/cm$^2$ | 3.8 | 3.9 |
| $V_b$ (v)  | 0      | 0      |

It is evident from the above table that an electrophotographic photoreceptor formed in accordance with the invention has sufficient charge retaining force, high sensitivity, and small residual potential. In addition, these desireable characteristics are maintained even after repetitive use. Accordingly, the invention can provide an electrophotographic photoreceptor having excellent characteristics.

EXAMPLE 25

A 0.25 μm thick perylene pigment CGL was formed by electrolysis as in Example 23. A PVK CTL, about 20 μm thick, was formed thereon as in Example 23. The results from the resulting photoreceptor are shown in the following table.

|            | First  | 200th  |
|------------|--------|--------|
| $V_a$ (v)  | −1100  | −1150  |
| $E_{\frac{1}{2}}$ erg/cm$^2$ | 3.7 | 3.9 |
| $V_b$ (v)  | 0      | 0      |

It is clear from the above table that the electrophotographic photoreceptor formed in accordance with the invention has sufficient charge retaining force, high sensitivity, and small residual potential. In addition, these desireable characteristics are maintained even after repetitive use. The invention can provide an electrophotographic photoreceptor having excellent characteristics.

In Examples 23 to 25, when the sensitivity was measured at an initial potential as low as 600 V, a sufficient value was obtained in each case.

As described above, since a uniform high-density and high-purity CGL films are formed in process in accordance with the invention, it is possible to produce a photoreceptor having good characteristics. Furthermore, the invention enables high productivity and hence, production of a photoreceptor at a low cost.

EXAMPLE 26

Figure 11A:
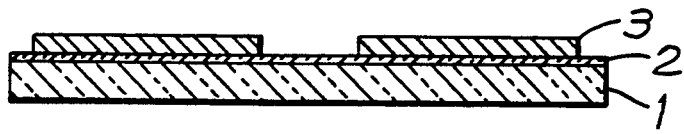
FIGS. 11A, 11B and 11C are cross-sectional views illustrating the steps of a process for forming a nonlinear switching element in accordance with the invention.

FIGS. 11A, 1lb and 11C show the processing steps involved in the manufacture of an active element 110 in accordance with the invention. A 1,000 Å thick conductive indium tin oxide (ITO) film was formed on a glass substrate 1. A 1 μm thick photosensitive epoxy acrylate film 3 was formed on ITO film 2. Photosensitive epoxy acrylate is an insulating material and film 3 was formed by patterning. Other insulating materials which allow film formation by patterning in addition to epoxy acrylate may be substituted. Minute 15×15 μm holes 6 were therein formed to expose portions of ITO film 2. Electrolysis was carried out in an electrolytic solution in which metal-free phthalocyanine was dispersed in a colloidal state. ITO film 2 on glass substrate 1 was used as an anode and a platinum electrode was used as a cathode.

The electrolytic solution had the following composition:

Metal-free phthalocyanine 5 g/l
Surfactant charged by electrolysis:
Ferrocenyl-PEG (produced by Dojin Kagaku) 1 mM
Supporting salt (LiBr) 0.05M Metal-free phthalocyanine was dispersed in the electrolytic solution in a colloidal state by an ultrasonic homogenizer, and the¹ supernatant was collected.

Figure 11B:
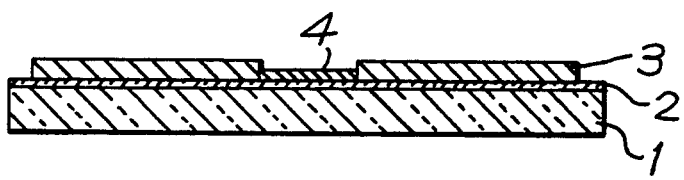
Figure 11C:
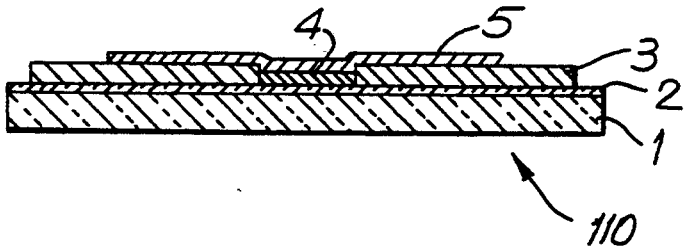

Electrolysis was carried out at a constant voltage of +0.4 V (vs. S.C.E.) for 10 minutes, and a 3,000 Å thick metal-free phthalocyanine film 4 was formed at minute hole portions 6 (15×15 μm) where ITO film 2 was exposed, as shown in FIG. 11B. After film 4 was dried at 150° C. for 15 minutes, a second 2,000 Å thick ITO film 5 was formed on the phthalocyanine film by sputtering as shown in FIG. 11C. Thus, element 110 having a thin-film structure of ITO—metal-free phthalocyanine—ITO was obtained.

Figure 12:
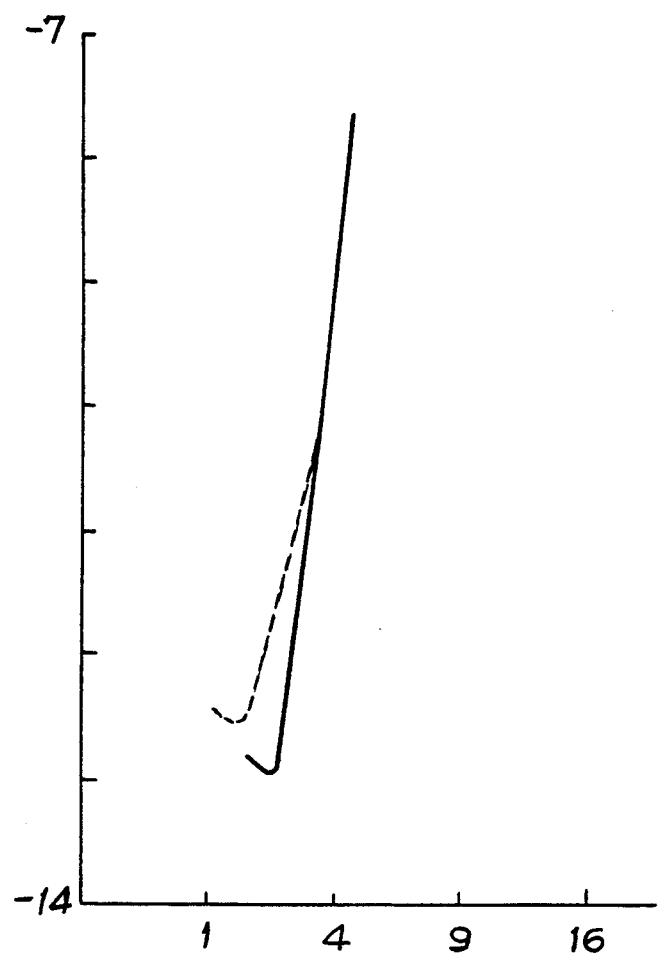
FIG. 12 is a graph illustrating nonlinear bi-directional current-voltage characteristics of a nonlinear switching element formed in accordance with an embodiment of the invention.

When a voltage was applied between ITO film 2 as a positive electrode and ITO film 5 as a negative electrode and the voltage is gradually raised, the nonlinear characteristic represented by a curve 1 in FIG. 12 were obtained. When positive electrode 2 and negative electrode 5 were reversed and a voltage was again applied and gradually raised, the nonlinear characteristics represented by a curve 2 in FIG. 12 were obtained. Nonlinear characteristic curve 2 was similar to nonlinear characteristic curve 1. Accordingly, this element exhibits almost the same nonlinear characteristic when the polarities of the applied voltage are reversed, showing that element 110 has a nearly symmetrical bi-directional nonlinear characteristic.

EXAMPLE 27

Metal-free octacyanophthalocyanine was used as an insulating material in forming an active element structure described in Example 26. Nearly the same bi-directional nonlinear characteristics as in Example 26 were obtained.

As described above, a nonlinear switching element having the same nonlinear characteristics as a conventional MIM (Metal-Insulator-Metal) element can be obtained. However, the element can have a larger effective area which facilitates patterning and it is possible to obtain a chemically stable phthalocyanine film by a wet process. Thus, the electrochemical deposition not only contributes to enhancing the performance per cost, but also facilitates manufacture of a large-sized active matrix color liquid crystal panel such as those which will become more popular and widespread.

It will thus be seen that the objects set forth above, among those made apparent from the preceding description are efficiently attained and, since certain changes may be made in carrying out the above method and in the articles set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly, it is to be understood that in said claims, ingredients or compounds recited in the singular are intended to include compatible mixtures of such ingredients wherever the sense permits.

What is claimed is:

1. A color filter comprising
a transparent substrate;
a transparent electrically conductive layer supported by the substrate in the form of spaced and substantially parallel electrode stripes;
a thin film with a thickness of from about 0.4 to 1.1 μm consisting of at least two different organic pigments and optionally including dopant material for increasing the electrical conductivity of the thin film, disposed on the conductive layer, the organic pigments being substantially insoluble in water, the thin film of organic pigments deposited on the conductive layer by electrolysis from a solution containing a redox reactive surfactant in which the organic pigments are colloidally dispersed, the two different pigments of the thin film each having different wavelength transmittance properties and a primary particle size of from 0.005 to 0.5 μm.

2. The color filter of claim 1, wherein the transparent substrate is formed from one of glass or plastic.

3. The color filter of claims 1, wherein the conductive layer is selected from the group consisting of layers of indiumtin oxide, tin oxide and combinations thereof.

4. The color filter of claim 1, wherein the organic pigments are selected from the group consisting of a phthalocyanine pigments, anthraquinone pigments, thioindigo pigments, perylene pigments, quinacridone pigments, dioxazine pigments, isoindolinone pigments, quinophthalone pigments, perinone pigment, nitro pigments, nitroso pigments, azo complex salt pigments, condensed azo pigments, benzoimidazolone pigments, metal complex pigments, aniline black, daylight fluorescent pigments, diketopyrrolopyrrole pigments and combinations thereof.

5. The color filter of claim 1, wherein the organic pigments have a hydrophilic surface nature that was converted into a hydrophobic surface nature.

6. The color filter of claim 1, wherein the surfactant is oxidizable or reducible by electrolysis and includes a metallocene group having a general formula

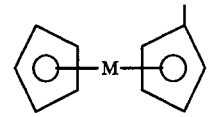

a hydrophobic end group in which M is a metal selected from the group consisting of Cr, Ti, Fe, V, Co, Ni, Ru, Os and Pd.

7. The color filter of claim 6, wherein M is a metal selected from the group consisting of Cr and Ti.

8. The color filter of claim 1, wherein the thin film includes a halogen containing dopant material.

9. The color filter of claim 1, wherein a light shielding film is disposed on the substrate between the stripes.

10. The color filter of claim 9, wherein the light-shielding film includes pigment and photosetting resin which will set upon exposure with light.

11. The color filter of claim 1, wherein the parallel electrode stripes of the conductive layer are not electrically coupled to each other.

12. The color filter of claim 1, wherein the substrate, conductive layer and thin film are constructed and arranged for use in a liquid crystal display.

13. The color filter of claim 1, wherein the spaced parallel stripes are arranged in groups, each group including at least one stripe having a different color thin film than the other stripes of the group; at least one stripe of the group of a different length than the other stripes of the group; the thin films being disposed on less than the entire length of each stripe; and insulating material present on at least a portion of one of the stripes.

14. The color filter of claim 1, wherein the organic pigments are selected from the group consisting of organic pigments with a hydrophobic surface nature and organic pigments with a hydrophilic surface nature.

15. A color filter for a liquid crystal display, comprising:
a transparent substrate;
a transparent electrically conductive layer disposed on a portion of the substrate in the form of three groups of substantially parallel electrode stripes;
a red thin film on a first group of stripes, a green thin film on a second group of stripes and a blue thin film on a third group of stripes, each thin film including at least two organic pigments having different light transmittance properties, the thin films having been disposed on the stripes by electrolysis from at least one solution containing a surfactant that is oxidizable or reducible, in which the organic pigments are colloidally dispersed, the organic pigments being substantially insoluble in water; the pigments having a primary particle size of between about 0.005 and 0.5 μm; and the thin films being about 0.4 to 1.1 μm thick 16. The color filter of claim 15, wherein the thin films of the same color are not on adjacent electrode stripes.

17. The color filter of claim 16, including light shielding material selectively disposed on the substrate to prevent light from passing through the filter without passing through the thin films.

18. The color filter of claim 15, wherein at least one of the groups of stripes is a different length than the other groups of stripes and at least one of the groups of stripes includes insulating material disposed thereon.

19. The color filter of claim 15, wherein the thin film includes dopant material for increasing the electrical conductivity of the thin film.

20. The color filter of claim 15, wherein the thin film includes a halogen containing dopant material.

21. A color filter, comprising a transparent substrate; at least two groups of substantially parallel transparent electrode stripes; at least two groups of differently colored thin film organic pigment layers having a thickness from about 0.4 to 1.1 $\mu$m, each group of differently colored thin films being on an associated group of electrodes, the groups of differently colored thin film layers being at least two groups selected from (a) red layers having an essential light transmission wavelength range substantially between 600 and 700 nm (b) blue layers having an essential light transmission wavelength in the range from about 450 to 500 nm or and (c) green layers having an essential light transmission wavelength range between about 500 and 550 nm, to form at least two groups of differently colored transparent electrode stripes; the thin film organic pigment layers being formed from pigments having a primary particle size between about 0.005 and 0.5 $\mu$m, the pigment layers being deposited from a colloidal dispersion of said organic pigments in an aqueous micelle solution of a redox reactive surfactant.

22. The color filter of claim 21, wherein the filter includes a red layer formed from a red pigment and a yellow pigment in a ratio of red pigment to yellow pigment of about 8:2.

23. The color filter of claim 21, wherein the filter includes a green layer formed from a green pigment and a yellow pigment in a ratio of green pigment to yellow pigment of about 6:4.

24. The color filter of claim 21, wherein the filter includes a blue layer formed with a blue pigment and a red violet pigment in a ratio of blue pigment to red violet pigment of about 7:3.

* * * * *